United States Patent
Aoki et al.

(10) Patent No.: US 9,172,927 B2
(45) Date of Patent: Oct. 27, 2015

(54) IMAGING DEVICE, AND IMAGE PROCESSING METHOD

(71) Applicant: FUJIFILM Corporation, Tokyo (JP)

(72) Inventors: Takashi Aoki, Saitama (JP); Hiroshi Endo, Saitama (JP); Yoichi Iwasaki, Saitama (JP); Kenkichi Hayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,514

(22) Filed: Jan. 5, 2015

(65) Prior Publication Data

US 2015/0124129 A1   May 7, 2015

Related U.S. Application Data

(63) Continuation of application No. PCT/JP2012/084089, filed on Dec. 28, 2012.

(30) Foreign Application Priority Data

Jul. 6, 2012   (JP) .................................. 2012-152818

(51) Int. Cl.
   *H04N 5/232*   (2006.01)
   *G03B 13/00*   (2006.01)
   (Continued)

(52) U.S. Cl.
   CPC ................ *H04N 9/077* (2013.01); *G02B 7/346* (2013.01); *G03B 13/36* (2013.01);
   (Continued)

(58) Field of Classification Search
   CPC . H04N 9/077; H04N 5/3696; H04N 5/23212; H04N 5/243; G02B 7/346; G02B 7/28

USPC .................................. 348/345, 349, 272, 273
See application file for complete search history.

(56) References Cited

U.S. PATENT DOCUMENTS

| 5,889,554 | A | 3/1999 | Mutze |
| 2009/0200451 | A1 | 8/2009 | Conners |

(Continued)

FOREIGN PATENT DOCUMENTS

| EP | 1793620 A1 | 6/2007 |
| JP | 2-210996 A | 8/1990 |

(Continued)

OTHER PUBLICATIONS

International Preliminary Report on Patentability, issued in PCT/JP2012/084089, dated Feb. 24, 2014.

(Continued)

*Primary Examiner* — Sinh Tran
*Assistant Examiner* — Zhenzhen Wu
(74) *Attorney, Agent, or Firm* — Birch, Stewart, Kolasch & Birch, LLP

(57) ABSTRACT

According to the present invention, since a color image for a moving image including that for live view display includes image data on pixel lines including first and second phase difference pixels, phase difference AF can be accurately performed during the moving image taking. A color image for the moving image includes not only the image data on the pixel lines including the first and second phase difference pixels, but also image data on pixel lines that do not include the first and second phase difference pixels and only include normal pixels. Accordingly, the image quality of the color image for the moving image is improved, an image interpolation process can be accurately performed, and reduction in image quality of a taken image (still image and moving image) through the phase difference pixels can be prevented or alleviated.

22 Claims, 14 Drawing Sheets

(51) Int. Cl.
  *H04N 9/077* (2006.01)
  *G03B 13/36* (2006.01)
  *H04N 5/369* (2011.01)
  *H04N 9/04* (2006.01)
  *G02B 7/34* (2006.01)
  *H04N 5/374* (2011.01)
  *H04N 9/64* (2006.01)
  *H04N 9/80* (2006.01)

(52) U.S. Cl.
  CPC ........ *H04N 5/23212* (2013.01); *H04N 5/3696* (2013.01); *H04N 5/3742* (2013.01); *H04N 9/045* (2013.01); *H04N 9/64* (2013.01); *H04N 9/80* (2013.01); *H04N 2209/046* (2013.01)

(56) References Cited

U.S. PATENT DOCUMENTS

| | | | |
|---|---|---|---|
| 2011/0267533 A1 | 11/2011 | Hirose | |
| 2012/0033115 A1 | 2/2012 | Fujii | |
| 2012/0224096 A1* | 9/2012 | Shimoda et al. | 348/349 |
| 2013/0107067 A1* | 5/2013 | Miyakoshi | 348/208.5 |
| 2014/0340565 A1* | 11/2014 | Kitani et al. | 348/349 |
| 2015/0022712 A1* | 1/2015 | Koishi | 348/352 |

FOREIGN PATENT DOCUMENTS

| | | |
|---|---|---|
| JP | 2009-89144 A | 4/2009 |
| JP | 2010-181751 A | 8/2010 |
| JP | 2010-258110 A | 11/2010 |
| JP | 2012-32723 A | 2/2012 |

OTHER PUBLICATIONS

International Search Report, issued in PCT/JP2012/084089, dated Apr. 9, 2013.
Written Opinion of the International Searching Authority, issued in PCT/JP2012/084089, dated Apr. 9, 2013.
Extended European Search Report dated Aug. 4, 2014, for European Application No. 11859479.5.
Extended European Search Report dated Jan. 27, 2015, for European Application No. 12804973.1.
Extended European Search Report dated Oct. 28, 2014, for European Application No. 11859950.5.
Hirakawa et al., "Spatio-Spectral Color Filter Array Design for Optimal Image Recovery", IEEE Transactions on Image Processing, vol. 17, No. 10, Oct. 2008, pp. 1876-1890.

* cited by examiner (a)

(b)

(c)

IMAGING DEVICE, AND IMAGE PROCESSING METHOD

CROSS-REFERENCE TO RELATED APPLICATIONS

This application is a Continuation of PCT International Application No. PCT/JP2012/084089 filed on Dec. 28, 2012, which claims priority under 35 U.S.C. §119(a) to Japanese Patent Application No. 2012-152818 filed on Jul. 6, 2012. Each of the above application(s) is hereby expressly incorporated by reference, in its entirety, into the present application.

BACKGROUND OF THE INVENTION

1. Field of the Invention

The present invention relates to an imaging device and an image processing method and, in particular, to an imaging device and an image processing method that perform moving image generation and focus adjustment based on phase difference in parallel.

2. Description of the Related Art

Conventionally, automatic focus adjustment (phase difference AF) has been known where first and second phase difference pixels on which a subject image having passed through left and right regions of an imaging lens is pupil-divided and image-formed are provided in a part of an image pickup element, the phase difference between output signals of the first and second phase difference pixels are detected, and the focus position of a focusing lens is adjusted on the basis of the detected phase difference.

An image pickup element described in PTL 1 (Japanese Patent Application Laid-Open No. 2009-89144) includes a typical Bayer array color filter. In the horizontal direction and the vertical direction, first pixels for detecting the focal position (pixels on the left side of pupil division) and second pixels for detecting the focal position (pixels on the right side of pupil division) are alternately arranged at a predetermined period (at a period of six pixels in the horizontal direction, and at a period of three pixels in the vertical direction). The first and second pixels for detecting the focal position are arranged on pixel positions where green (G) filters are arranged.

In the case of detecting the focal point, an electronic camera described in PTL 1 thinning-reads an image on lines (line image) where the first and second pixels for detecting the focal point are arranged, detects the focus position on the basis of the image signal of the first and second pixels for detecting the focal point in the thinning-read line image, and controls the position of the focusing lens, while performing live view display in real time on the basis of the image signal of the thinning-read line image (including the first and second pixels for detecting the focal point). In the case of not detecting the focal point, an line image where the first and second pixels for detecting the focal point are not arranged is read, and live view display is performed on the basis of the image signal of the line image.

In the case of detecting the focal point, the electronic camera described in PTL 1 pairs the first or second pixels for detecting the focal point (G pixels) and red pixels (R pixels) or blue pixels (B pixels) that are adjacent to the G pixels with each other and extracts signals from the thinning-read line image, and performs live view display on the basis of the image signal of the extracted pixels. Accordingly, image signals of typical G pixels (G pixels other than the first or second pixels for detecting the focal point) are not used for live view display in the case of detecting the focal point.

SUMMARY OF THE INVENTION

The invention described in PTL 1 detects the focal point, and, for live view display, uses the thinning-read first or second pixels for detecting the focal point as G pixels. However, the pixels for detecting the focal point have structures different from the structures of typical pixels. Accordingly, it is inappropriate to use the pixels themselves for detecting the focal point as G pixels.

Furthermore, the array of color filters of the image pickup element described in PTL 1 is a Bayer array. Accordingly, the thinning-read image also conforms to a Bayer array. Therefore, even if the image signal of the pixels for detecting the focal point is acquired by interpolation with adjacent image signals having the same color, vertically and horizontally adjacent pixels are not pixels having the same color, thereby causing a problem in that false colors and the like due to interpolation tend to occur.

The present invention is made in view of such a situation. It is an object of the present invention to provide an imaging device and an image processing method that can accurately perform phase difference AF during taking a moving image including live view display, and prevent or alleviate reduction in quality of a taken image due to phase difference pixels.

An aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color, and second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

Another aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color having a peak of transmittance within a wavelength range from 480 nm to 570 nm, and second filters corresponding to at least two second colors having peaks of transmittance out of this range, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

Another aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color, and second filters corresponding to at least two second colors having lower transmittances than the first filters within a wavelength range from 500 nm to 560 nm, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

Another aspect of the present invention relates to an imaging device, including: an imaging lens; an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed; a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating device which generates moving image data, based on the thinned color image; a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least two first colors that include a color most contributing to luminance signals among three primary colors and a fourth color different from the three primary colors, and second filters corresponding to at least two second colors other than the first colors, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

According to these aspects, since the image data on the first and second phase difference pixels in the line image extracted for the moving image including that for live view display, phase difference AF can be accurately performed even during moving image taking. Furthermore, the color image including the thinning-read or extracted line image includes not only the image data including the first and second phase difference pixels, but also image data on pixel lines that do not include the first and second phase difference pixels and only include normal pixels. Accordingly, an image interpolation process can be accurately performed using the image data on the normal pixels, thereby allowing reduction in image quality of the taken image (still image and moving image) through the phase difference pixels to be prevented or alleviated. Note that in these aspects, for instance, the first filters may be green (G) filters, and the second filters may be red (R) filters and blue (B) filters. However, the first filters and the second filters are not limited to these color filters.

Preferably, in the thinned color image, pixels having a color identical to a color of pixels at positions of the first and second phase difference pixels are arranged adjacent to the first and second phase difference pixels, the device further comprises an interpolating calculation device which calculates pixel values of the pixels at the positions of the first and second phase difference pixels in the thinned color image by interpolation with pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

According to this aspect, since the pixels having the color of the first and second phase difference pixels are arranged on the pixels adjacent to the first and second phase difference pixels, an interpolation process of the pixel data on the first and second phase difference pixels can be accurately performed.

Preferably, the thinning pattern has an extraction pixel period defining a period in the second direction pertaining to thinning-reading or extraction of the pixel signals, and the number of pixels t1 pertaining to the second direction between the first phase difference pixel and the second phase difference pixel and the number of corresponding pixels t2 of the extraction pixel period in the second direction satisfy t1=t2×1 (1 is an integer equal to or greater than one).

According to this aspect, the number of pixels between the first phase difference pixel and the second phase difference pixel is an integral multiple of the number of corresponding pixels of the extraction pixel period, thereby enabling the image data on the pixel line including the first phase difference pixel and the pixel line including the second phase difference pixel to be efficiently read.

Preferably, the thinning pattern has an extraction pixel period defining a period in the second direction pertaining to thinning-reading or extraction of the pixel signals, and the number of pixels corresponding to a repetition period of the first phase difference pixel and the second phase difference pixel in the second direction is a common multiple of the number of corresponding pixels of the extraction pixel period in the second direction and the number of pixels of the basic array pattern in the second direction.

According to this aspect, the repetition period of the phase difference pixel in the second direction is an common multiple of the extraction pixel period and the number of pixels of the basic array pattern in the second direction, thereby enabling the image data on the pixel lines including the first phase difference pixel and the second phase difference pixel to be efficiently read.

Preferably, the number of pixels between the first phase difference pixel and the second phase difference pixel in the second direction is different from the number of pixels of the basic array pattern in the second direction.

According to this aspect, the first phase difference pixel and the second phase difference pixel are arranged on different positions in the basic array pattern.

Preferably, the extracted pixel group pertains to array patterns of the first filters and the second filters, and has an array pattern identical to the basic array pattern.

According to this aspect, the extracted pixel group has the array pattern identical to the basic array pattern, thereby enabling a common image processing to be applied to color images before and after application of thinning-reading.

Preferably, in the color filter array, a ratio of the number of all pixels having the first color corresponding to the first filters is greater than ratios of the numbers of pixels of the respective second colors corresponding to the second filters, and the first and the second phase difference pixels are arranged on positions of the first filters.

According to this aspect, the ratio of the number of pixels having the first color is greater than the ratios of the numbers of pixels of the respective second colors, thereby allowing the pixel data having the first color to be utilized more efficiently. Furthermore, by arranging the phase difference pixel at the position of the first filter corresponding to the first color, the interpolation process of the pixel data on the phase difference pixels can be effectively performed effectively using many pixels having the same first color.

Preferably, the first filters are arranged in M×N pixels (M, N: integers equal to or greater than three), and the M×N pixels are repeatedly arranged in the first and second directions.

According to this aspect, the first filters are arranged at an M×N pixel period.

Preferably, one or two phase difference pixels that are one of the first and the second phase difference pixels are arranged in the M×N pixels.

According to this aspect, the first phase difference pixel and the second phase difference pixel can be arranged at a period based on the M×N pixels.

Preferably, the first and the second phase difference pixels are arranged as a pair in the second direction.

According to this aspect, AF (auto-focus) control using the first and second phase difference pixels can be accurately performed in the second direction.

Preferably, the first and second phase difference pixels are alternately arranged on one pixel line extending in the first direction.

According to this aspect, AF (auto-focus) control using the first and second phase difference pixels can be accurately performed in the first direction.

Preferably, the first filters are arranged on the first and second phase difference pixels, and the pixel line that does not include any of the first phase difference pixel and the second phase difference pixel in the extracted pixel group includes pixels corresponding to the first filters.

More preferably, in the extracted pixel group, the pixels corresponding to the first filters on the pixel line that does not include any of the first phase difference pixel and the second phase difference pixel are arranged on positions adjacent to the first phase difference pixel or the second phase difference pixel.

According to this aspect, the first filters arranged on the first phase difference pixel and the second phase difference pixel and the first filters included in the pixel line that does not any of include the first phase difference pixel and the second phase difference pixel are common to each other. Accordingly, during the process of interpolating the phase difference pixels, the pixel data included on the pixel line that does not include any of the first phase difference pixel and the second phase difference pixel can be effectively used.

Here, the case where pixels are adjacent to each other may include the case where pixels are at positions touching four sides of the target filters or pixels, and further include the case of pixels having the center at a position apart by √2 pixels from the center of the target filters or pixels. For instance, in the case of a square array, the filters or pixels arranged at the positions adjacent in the upper, lower, left and right directions (first direction and second direction) to the target filters or pixels, or at positions adjacent in diagonally upper right, lower left, upper left and lower right directions are adjacent to the target filters or pixels.

Preferably, in the basic array pattern, the color filters are arranged according to an array pattern corresponding to M×M (M is an integer equal to or greater than three) pixels in the first direction and the second direction, and the basic array pattern in which the first phase difference pixel is arranged, the basic array pattern in which the second phase difference pixel is arranged, and at least one basic array pattern that does not include any of the first phase difference pixel and the second phase difference pixel are arranged in the second direction.

Preferably, in the basic array pattern, the color filters are arranged according to an array pattern corresponding to M×N (M is an integer equal to or greater than three, and N is an even number equal to or greater than six) pixels in the first direction and the second direction, the basic array pattern includes each one of two types of sub-arrays which are a first sub-array and a second sub-array and in which the color filters are arranged according to an array pattern corresponding to M×(N/2) pixels, in each of the first sub-array and the second sub-array, at least one pixel of each of the first filters and the second filters corresponding to the respective second colors is arranged, and the basic array pattern that includes the first phase difference pixel and the second phase difference pixel, and the basic array pattern that does not include any of the first phase difference pixel and the second phase difference pixel are arranged in the second direction, and the first phase difference pixel is arranged in the first sub-array, and the second phase difference pixel is arranged in the second sub-array.

Preferably, in the basic array pattern, the color filters are arranged according to an array pattern corresponding to M×M (M is an integer equal to or greater than six) pixels in the first direction and the second direction, and the basic array pattern includes each two of two types of sub-arrays which are first sub-arrays and second sub-arrays and in which the color filters are arranged according to an array pattern corresponding to (M/2)×(M/2) pixels, in each of the first sub-array and the second sub-array, at least one pixel of each of the first filters and the second filters corresponding to the respective second colors is arranged, and the first sub-array that includes the first phase difference pixel, the second sub-array that does not include any of the first phase difference pixel and the second phase difference pixel, the first sub-array that includes the second phase difference pixel, and the second sub-array that does not include any of the first phase difference pixel and the second phase difference pixel are arranged in the second direction.

Preferably, the first color is a green (G) color, the second colors are a red (R) color and a blue (B) color, the first filters are G filters, and the second filters are R filters and B filters, in the basic array pattern, the color filters are arranged according to an array pattern corresponding to 6×6 pixels in the first direction and the second direction, and the first sub-array and the second sub-array are arranged according to an array pattern corresponding to 3×3 pixels in the first direction and the second direction, the first sub-array is arranged in one of diagonal line directions of the basic array pattern, and the second sub-array is arranged in another diagonal line direction of the basic array pattern, the G filters are arranged on a center pixel and four corner pixels of each of the first sub-array and the second sub-array, the R filters are arranged on pixels adjacent in the second direction to the center pixel in the first sub-array, and pixels adjacent in the first direction to the center pixel in the second sub-array, the B filters are arranged on pixels adjacent in the first direction to the center pixel in the first sub-array, and pixels adjacent in the second direction to the center pixel in the second sub-array, and the G filters are arranged on the first phase difference pixel and the second phase difference pixel.

Preferably, pixels having transparent filters are used for the first and second phase difference pixels.

According to this aspect, the transparent filters allows light in a visible light wavelength range to be highly efficiently pass, thereby enabling pixel data on the first phase difference pixel and the second phase difference pixel to be efficiently acquired.

Another aspect of the present invention relates to an image processing method in an imaging device comprising an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image data by the moving image generating step, wherein the prescribed color filter array includes first filters corresponding to at least one first color, second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition step from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

Another aspect of the present invention relates to an image processing method in an imaging device including an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image data by the moving image generating step, wherein the prescribed color filter array includes first filters corresponding to at least one first color having a peak of transmittance within a wavelength range from 480 nm to 570 nm, and second filters corresponding to at least two second colors having peaks of transmittance out of this range, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition step from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

Another aspect of the present invention relates to an image processing method in an imaging device including an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image data by the moving image generating step, wherein the prescribed color filter array includes first filters corresponding to at least one first color, and second filters corresponding to at least two second colors having lower transmittances than the first filters within a wavelength range from 500 nm to 560 nm, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition step from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

Another aspect of the present invention relates to an image processing method in an imaging device including an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including: a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image; a moving image generating step of generating moving image data, based on the thinned color image; a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image data by the moving image generating step, wherein the prescribed color filter array includes first filters corresponding to at least two first colors that include a color most contributing to luminance signals among three primary colors and a fourth color different from the three primary colors, and second filters corresponding to at least two second colors other than the first colors, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition step from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction.

The image processing methods of the foregoing aspects can also accurately perform phase difference AF during moving image taking in a manner analogous to that of the foregoing imaging devices, and prevent or alleviate reduction in image quality of the taken image due to the phase difference pixels.

According to the present invention, since a color image for a moving image including that for live view display includes image data on pixel lines including first and second phase difference pixels, phase difference AF can be accurately performed even during the moving image taking. A color image for the moving image including that for live view display includes not only the image data on the pixel lines including the first and second phase difference pixels, but also image data of pixel lines that do not include the first and second phase difference pixels and only include normal pixels. Accordingly, the image quality of the color image for the moving image can be improved, an image interpolation process can be accurately performed and reduction in image quality of the taken image (still image and moving image) due to the phase difference pixels can be prevented or alleviated.

DETAILED DESCRIPTION OF THE EMBODIMENTS

Hereinafter, preferable embodiments of an imaging device and an image processing method according to the present invention are described in detail with reference to the accompanying drawings.

[Imaging Device]

Figure 1:
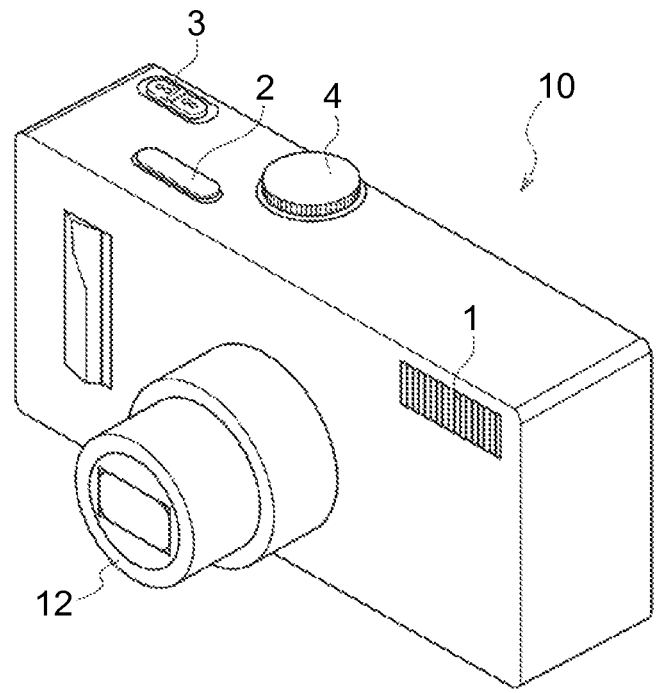
FIG. 1 is a perspective view showing an imaging device.
Figure 2:
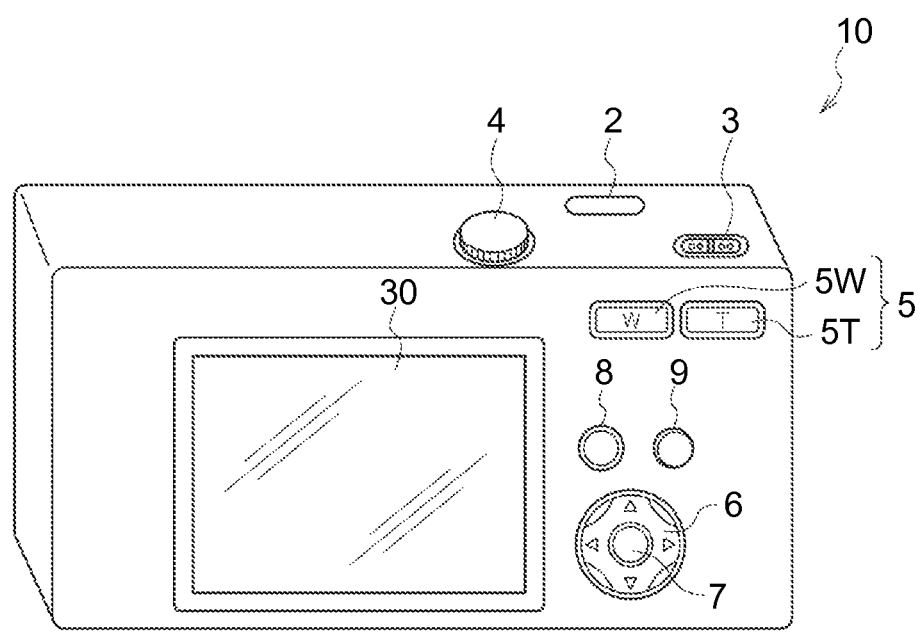
FIG. 2 is a rear view of the imaging device shown in FIG. 1.

FIG. 1 and FIG. 2 are a perspective view and a rear view, respectively, showing an example of an imaging device (digital camera). This imaging device 10 is a digital camera that causes an image pickup element to receive light having passed through a lens, converts the light into a digital signal, and records the signal as image data on a still image or a moving image into a recording medium.

As shown in FIG. 1, the imaging device 10 includes an imaging lens 12, an electronic flash 1 and the like on the front surface, and further includes a shutter release button 2, a power/mode switch 3, a mode dial 4 and the like on the top surface. Meanwhile, as shown in FIG. 2, a liquid crystal monitor 30 for 3D display, a zoom button 5, a cross button 6, a MENU/OK button 7, a playback button 8, a BACK button 9 and the like are arranged on the rear surface of the camera.

The imaging lens 12 may be a collapsible zoom lens. This lens telescopes out of a camera main body by setting an operation mode of the camera to an imaging mode through the power/mode switch 3. The electronic flash 1 is for illuminating a main subject with flush light.

The shutter release button 2 includes a two-step stroke switch that includes what are called "halfway pressed" and "fully pressed" states. The imaging device 10 operates AE/AF by a "halfway pressed" operation of the shutter release button 2 being pressed halfway during being driven in the imaging mode, and performs imaging by a "fully pressed" operation of the button being further pressed from the "halfway pressed" state. During being driven in the imaging mode, the imaging device 10 performs imaging by the shutter release button 2 being "fully pressed".

The power/mode switch 3 has both of a function as a power switch of turning on and off the power of the imaging device 10 and a function as a mode switch of setting the mode of the imaging device 10, and is arranged slidably among an "OFF position", a "play back position" and an "imaging position". The power of the imaging device 10 is turned on by sliding the power/mode switch 3 to adjust the position to the "play back position" or the "imaging position". The power is turned off by adjusting the position to the "OFF position". The mode is set to the "playback mode" by sliding the power/mode switch 3 to adjust the position to the "playback mode". The mode is set to the "imaging mode" by adjusting the position to the "imaging position".

The mode dial 4 functions as an imaging mode setting device which sets the imaging mode of the imaging device 10. According to the setting position of the mode dial, the imaging mode of the imaging device 10 is set to various modes. For instance, the modes are a "still image taking mode" for taking a still image, a "moving image taking mode" for taking a moving image and the like.

The liquid crystal monitor 30 displays a live view image (through image) in the imaging mode, displays a still image or a moving image in the playback mode, and displays a menu screen and the like, thereby functioning as a part of a graphical user interface (GUI).

The zoom button 5 functions as a zoom instruction device which instructs zooming, and includes a tele button 5T for instructing zooming to a telescopic side and a wide button 5W for instructing zooming to the wide angle side. In the imaging mode, the imaging device 10 changes the focal length of the imaging lens 12 according to operations on the tele button 5T and the wide button 5W. In the playback mode, operations on the tele button 5T and the wide button 5W enlarge and reduce an image being played back.

The cross button 6 is an operation unit for receiving instructions in four directions, which are vertical and horizontal directions, and functions as a button (a cursor movement operation device) for selection of an item from a menu screen, and instructions of selecting various setting items from each menu. A left/right key functions as a frame feeding (forward direction/reverse direction feeding) button in the playback mode.

The MENU/OK button 7 is an operation button that has both a function as a menu button for issuing an instruction for displaying a menu on a screen of the liquid crystal monitor 30 and a function as an OK button for issuing an instruction for determining and executing selection contents.

The playback button 8 is a button for switching the mode to the playback mode for displaying, on the liquid crystal monitor 30, a still image or a moving image which has been taken and recorded.

The BACK button 9 functions as a button for designating cancellation of an input operation and reversal to the previous operation state.

In the imaging device 10 according to this embodiment, dedicated members are not necessarily provided for buttons and switches. Alternatively, a touch panel may be provided; the functions of the buttons and switches may be achieved by operations on this panel.

[Internal Configuration of Imaging Device]

Figure 3:
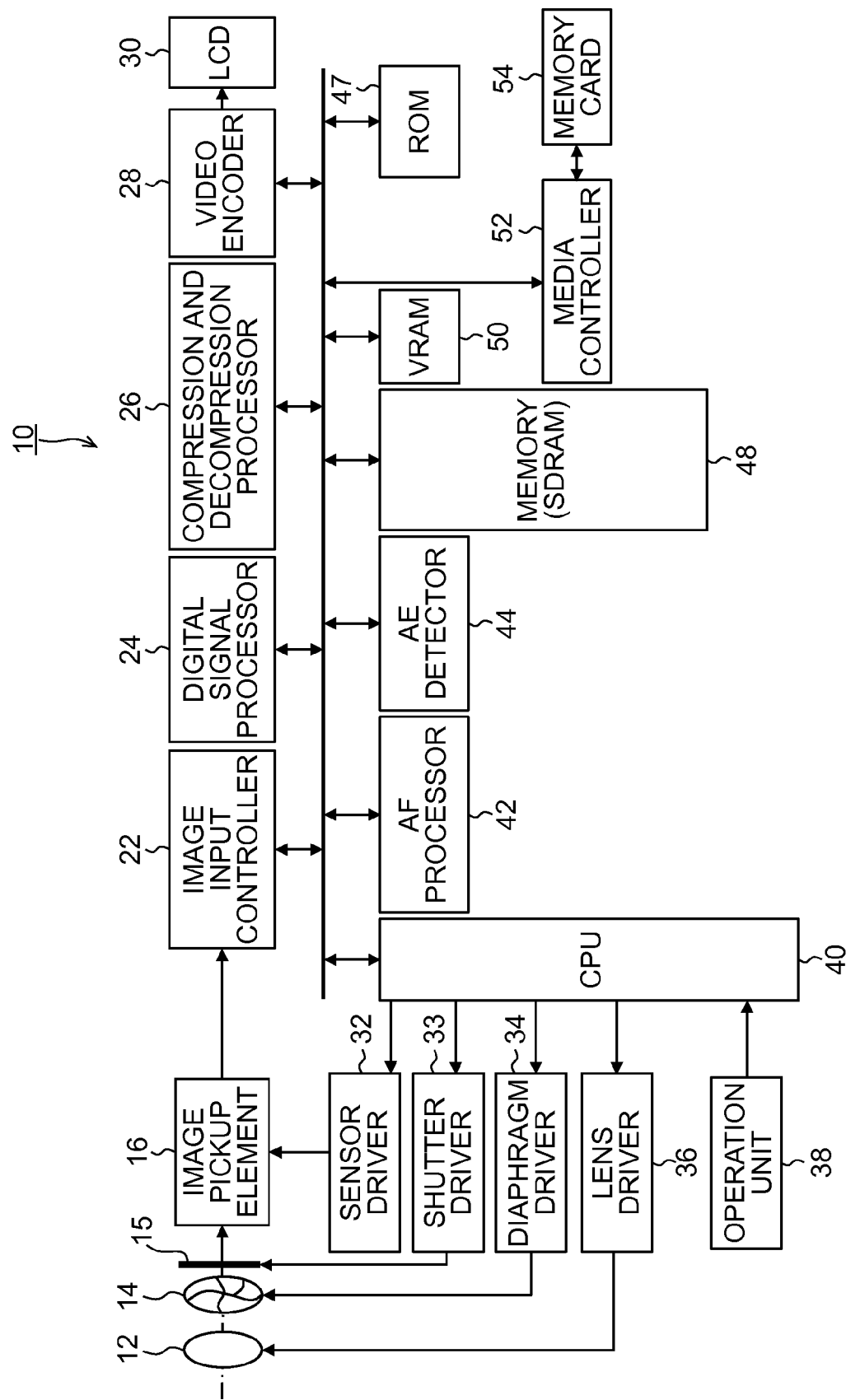
FIG. 3 is a block diagram showing an example of an internal configuration of the imaging device shown in FIG. 1.

FIG. 3 is a block diagram showing an embodiment of an internal configuration of the imaging device 10. The imaging device 10 records taken images in a memory card 54. The overall operation of the device is integrally controlled by a central processing unit (CPU) 40.

The imaging device 10 is provided with an operation unit 38, such as the foregoing shutter release button 2, power/mode switch 3, mode dial 4, tele button 5T, wide button 5W, cross button 6, MENU/OK button 7, playback button 8, and BACK button 9. A signal from the operation unit 38 is input into the CPU 40. The CPU 40 controls each circuit in the imaging device 10 on the basis of the input signal, for instance, to perform image sensor driving control, lens driving control, diaphragm driving control, imaging operation control, image processing control, control of recording/playing back image data, and display control on the liquid crystal monitor 30.

When the power of the imaging device 10 is turned on through the power/mode switch 3, power is supplied from a power source unit, which is not shown, to each block to start driving the imaging device 10.

A light flux having passed through the imaging lens 12, a diaphragm 14, a mechanical shutter (mechanically operated shutter) 15 and the like is image-formed on an image pickup element 16, which is a CMOS (Complementary Metal-Oxide Semiconductor) type color image sensor. The image pickup element 16 is not necessarily the CMOS type. Alternatively, this element may be an XY address type or CCD (Charge Coupled Device) type color image sensor.

In the image pickup element 16, many light receiving elements (photodiodes) are two-dimensionally arranged. A subject image formed on the light receiving surfaces of respective photodiodes is converted into a signal voltage (or charge) according to the amount of incident light, further converted into a digital signal through an A/D converter in the image pickup element 16, and output.

<Embodiment of Image Pickup Element>

The image pickup element 16 has a configuration where color filters arranged in a color filter array exemplified below are provided on respective pixels including photoelectric conversion elements (photodiodes) arranged in a horizontal direction (first direction) and a vertical direction (second direction).

Figure 4:
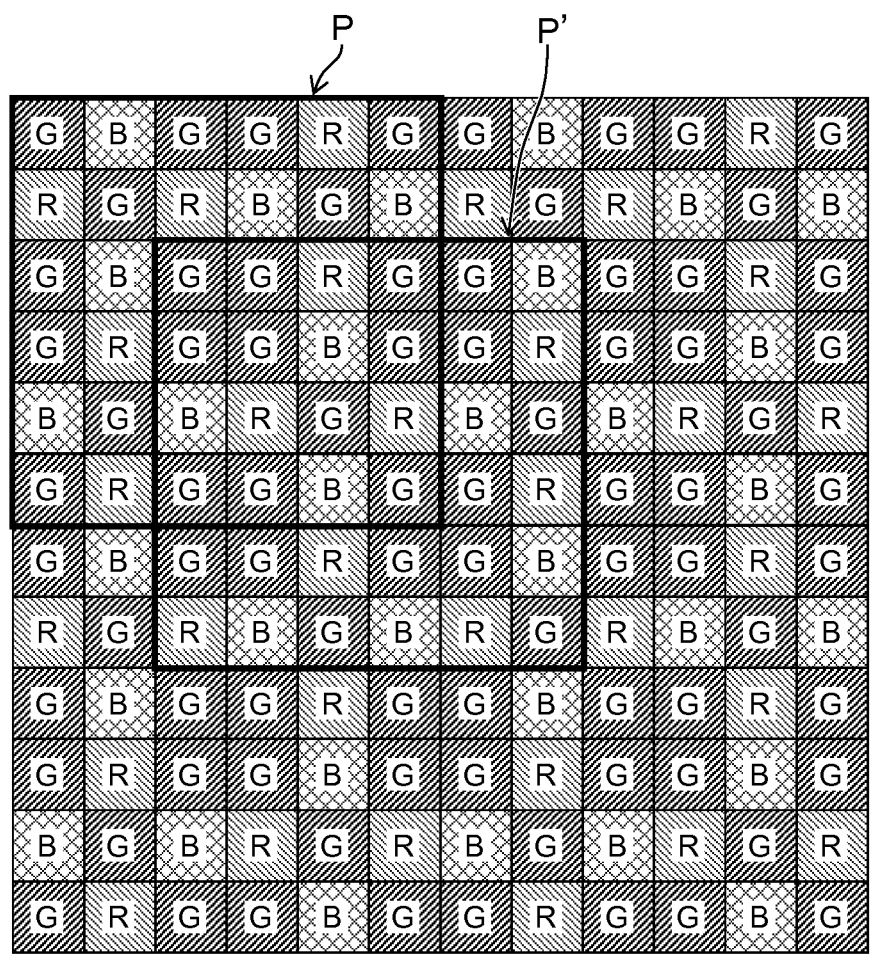
FIG. 4 is a diagram showing an example of a color filter array arranged in an image pickup element.

FIG. 4 is a diagram showing an example of the image pickup element 16. In particular, this diagram shows a novel color filter array arranged on the light receiving surface of the image pickup element 16.

The color filter array of the image pickup element 16 includes a basic array pattern P (pattern indicated by a thick frame) including color filters arranged in the horizontal direction and the vertical direction according to an array pattern corresponding to 6×6 (M×M) pixels. This basic array pattern P is arranged repeatedly in the horizontal direction (lateral direction: first direction) and the vertical direction (upper and lower direction: second direction). That is, in this color filter array, filters of colors of red (R), green (G) and blue (B) (R filters, G filters and B filters) are cyclically arranged. Since the R filters, G filters and B filters are thus arranged cyclically, image processing of RAW data of RGB (mosaic image) read from the image pickup element 16 can be performed according to the repetitive pattern.

Note that the 6×6-pixel basic array pattern is not limited to the foregoing basic array pattern P. Alternatively, a 6×6-pixel basic array pattern P' (see FIG. 4) cut from a position different from the position of the basic array pattern P may be considered a basic array pattern.

In the color filter array shown in FIG. 4, at least one G filter corresponding to a color that most contributes to acquiring a luminance signal (color of G in this embodiment) is arranged each of pixel lines in the horizontal, vertical, diagonally upper right, and diagonally upper left directions in the color filter array. Here, the pixel line is a line on which one series of pixels are arranged in the horizontal, vertical, diagonally upper right or diagonally upper left direction, and also simply referred to as "line" in the following description.

The diagonally upper right direction and the diagonally lower right direction in this embodiment are directions inclined by 45° from the horizontal direction and the vertical direction, respectively. This is because the multiple pixels and color filters are arranged in a square lattice in the horizontal direction and the vertical direction. Accordingly, if the multiple pixels and color filters are arranged in a rectangular lattice, the diagonal directions of the rectangular lattice (unit pixels) correspond to the diagonally upper right direction and the diagonally lower right direction.

Since the G filters corresponding to luminance pixels are arranged in each of lines in the horizontal, vertical, diagonally upper right, and diagonally upper left directions in the color filter array, the reproduction accuracy in simultaneous processing in a high frequency region can be improved, irrespective of a direction to be high frequency in an input image. Here, the simultaneous processing is a process of calculating color information on all of RGB for each pixel from a RGB mosaic image according to the color filter array of a single plane color image pickup element (conversion into a simultaneous system), and also referred to as a demosaic process or a demosaicing process (identically applicable in this specification).

In the color filter array shown in FIG. 4, at least one R filter and at least one B filter corresponding to at least two colors other than the color of G (colors of R and B in this embodiment) are arranged in each of pixel lines in the horizontal and vertical directions in the basic array pattern P.

Since the R filters and the B filters are arranged on each of pixel lines in the horizontal and vertical directions in the color filter array, occurrence of a false color (color moire) can be reduced. This reduction can omit an optical low pass filter for reducing (suppressing) occurrence of a false color. Even in the case of applying an optical low pass filter, a filter having a weak effect of cutting a high frequency component for preventing occurrence of a false color can be applied, thereby preventing the resolution from being degraded.

Furthermore, in the basic array pattern P of the color filter array shown in FIG. 4, the numbers of pixels of R pixels, G pixels and B pixels corresponding to the R filters, G filters and B filters in the basic array pattern are 8 pixels, 20 pixels and 8 pixels, respectively. That is, the ratios of the numbers of pixels of RGB pixels are 2:5:2. The ratio of the number of G pixels that most contributes to acquiring a luminance signal is higher than the ratios of the numbers of the R pixels and the B pixels that have other colors.

As described above, the ratio of the number of pixels of G pixels is different from the ratios of the numbers of pixels of the R and B pixels. In particular, the ratio of the number of pixels of G pixels that most contributes to acquiring a luminance signal is configured to be higher than the ratios of the numbers of pixels of the R and B pixels. Accordingly, aliasing in simultaneous processing can be suppressed, and high frequency reproducibility can be improved.

Figure 5:
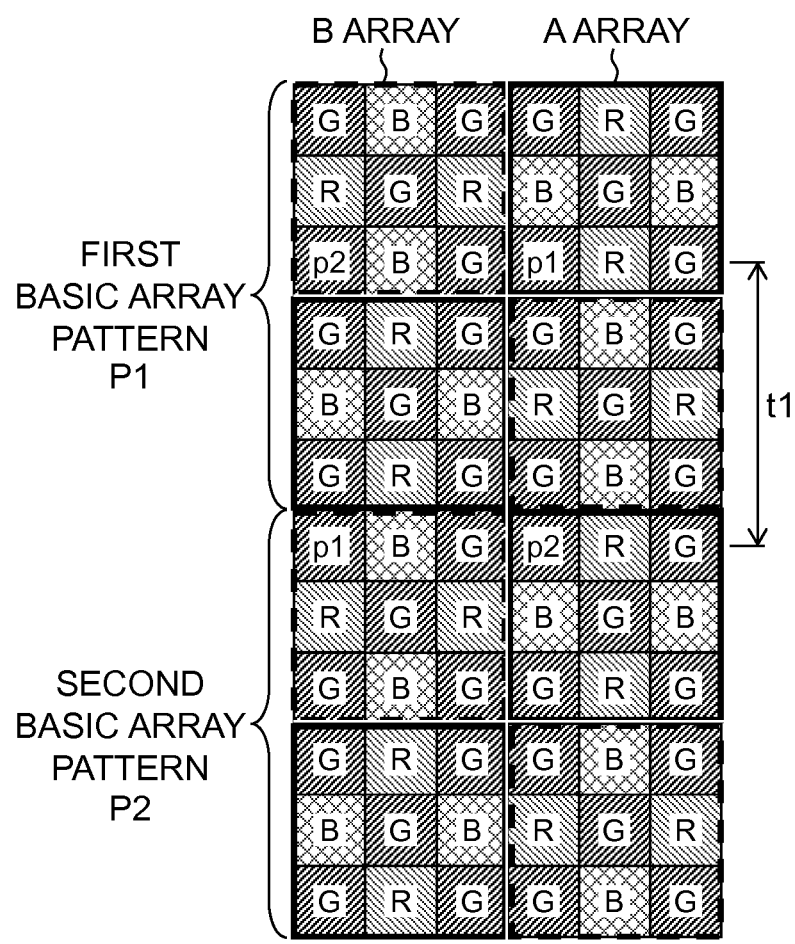
FIG. 5 is a diagram showing an example of a basic array pattern of the color filter array of FIG. 4.

FIG. 5 shows a state where the basic array pattern P shown in FIG. 4 is divided into four each including 3×3 ((M/2)×(M/2)) pixels and a first array example of phase difference pixels described later.

The basic array pattern P can also be regarded as an arrangement where A arrays (first sub-arrays) enclosed by solid line frames arranged in an array pattern corresponding to 3×3 pixels in the horizontal direction and the vertical direction and B arrays (second sub-arrays) enclosed by broken line frames each arranged according to an array pattern corresponding to 3×3 pixels are alternately arranged in the horizontal direction and the vertical direction as shown in FIG. 5. Thus, the A arrays are arranged in one diagonal direction of the basic array pattern P, and the B arrays are arranged in the other diagonal direction of the basic array pattern P.

In each of the A arrays and the B arrays, the G filters (first color) are arranged on pixels at the four corners and the center, thus being arranged on both the diagonal lines. In the A array, the R filters (first component color) are arranged in the vertical direction, and the B filters (second component color) are arranged in the horizontal direction, sandwiching the G filter at the center. Meanwhile, in the B array, the B filters are arranged in the vertical direction, and the R filters are arranged in the horizontal direction, sandwiching the G filter at the center. Accordingly, the R filters are arranged on pixels vertically adjacent to the center pixel in the A array, and at pixels horizontally adjacent to the center pixel in the B array. The B filters are arranged on pixels horizontally adjacent to the center pixel in the A array, and at pixels vertically adjacent to the center pixel in the B array. That is, between the A array and the B array, the positional relationships of the R filters and the B filters are replaced with each other, but the position of the G filters are the same.

The G filters at the four corners in the A array and the B array configure the G filters of a square array corresponding to 2×2 pixels by alternately arranging the A arrays and the B arrays in the horizontal direction and the vertical direction.

In the color filter array having the foregoing array pattern, the kernel period pertaining to the G pixels (image processing unit having regularity) is a three-pixel period, while the kernel periods pertaining to the R pixels and B pixels are a six-pixel period. Thus, the kernel period of G pixels does not necessarily match with the kernel periods of the R pixels and the B pixels.

The color filter array according to this embodiment includes multiple phase difference pixels for AF control described later (first phase difference pixels p1 and second phase difference pixels p2). These phase difference pixels are periodically arranged in the horizontal direction and the vertical direction. As to the arrangement of the first phase difference pixels p1 and the second phase difference pixels p2, the basic array patterns P can be classified into a "first basic array pattern P1" and a "second basic array pattern P2". In the color filter array according to this embodiment, the "first basic array pattern P1" and the "second basic array pattern P2" that have different arrangements of the first phase difference pixels p1 and the second phase difference pixels p2 are alternately arranged in the vertical direction. In the horizontal direction, "the first basic array pattern P1" and the "second basic array pattern P2" are continuously arranged (see FIG. 10).

The first phase difference pixel p1 is arranged in the A array that is one array in the first basic array pattern P1, and in the B array that is one array in the second basic array pattern P2. The second phase difference pixel p2 is arranged in the B array that is one array in the first basic array pattern P1, and in the A array that is one array in the second basic array pattern P2. More specifically, in the first basic array pattern P1, the first phase difference pixel p1 is arranged at the position of the G pixel at the lower left corner of the A array arranged on an upper side in the vertical direction, and the second phase difference pixel p2 is arranged at the position of the G pixel at the lower left corner of the B array arranged on an upper side in the vertical direction. Furthermore, in the second basic array pattern P2, the second phase difference pixel p2 is arranged at the position of the G pixel at the upper left corner of the A array arranged on an upper side in the vertical direction, and the first phase difference pixel p1 is arranged at the position of the G pixel at the upper left corner of the B array arranged on an upper side in the vertical direction.

Accordingly, the first phase difference pixels p1 and the second phase difference pixels p2 are arranged on pixel lines where the G filters are densely arranged in the horizontal direction (relatively many pixels are arranged), but are not arranged on pixel lines where the G filters are sparsely arranged in the horizontal direction (relatively small number of pixels are arranged). Thus, many G pixels with the same color are arranged around the first phase difference pixels p1 and the second phase difference pixels p2. In this example, as shown in the (a) portion of FIG. 10, for the first phase difference pixels p1 and the second phase difference pixels p2, the G pixels having the same color are arranged on "the left pixel (horizontal pixel), the lower pixel (vertical pixel) and the lower left pixel (diagonal pixel)" or "the left pixel (horizontal pixel), the upper pixel (vertical pixel) and the upper left pixel (diagonal pixel)". Accordingly, even when a still image is taken without thinning-reading (extracting) a line image like moving image taking described later, an interpolation process can be accurately applied to image data on these phase difference pixels using image data on the same color pixels around the first phase difference pixels p1 and the second phase difference pixels p2.

In the color filter array shown in FIG. 5, the first phase difference pixel p1 and the second phase difference pixel p2 are alternately arranged on one pixel line extending in the vertical direction. For instance, the first phase difference pixel p1 in the first basic array pattern P1 and the second phase difference pixel p2 in the second basic array pattern P2, and the second phase difference pixel p2 in the first basic array pattern P1 and the first phase difference pixel p1 in the second basic array pattern P2 are arranged as pairs in the vertical direction, and can be utilized as phase difference pixel pairs. The first phase difference pixel p1 and the second phase difference pixel p2 are alternately arranged on one pixel line extending in the horizontal direction. For instance, the first phase difference pixel p1 in the A array and the second phase difference pixel p2 in the B array in the first basic array pattern P1, and the second phase difference pixel p2 in the A array and the phase difference pixel p1 in the B array in the second basic array pattern P2 are arranged as pairs in the horizontal direction, and can be utilized as phase difference pixel pairs.

In this case, the number of pixels t1 in the vertical direction between the first phase difference pixel p1 and the second phase difference pixel p2 that form a pair in the vertical direction is "4", which is a multiple of two (even number). The repetition period of the first phase difference pixel p1 and the second phase difference pixel p2 in the vertical direction is with reference to the two basic array patterns P. The specific number of corresponding pixels is "12".

Accordingly, the position of the first phase difference pixel p1 in the first basic array pattern P1 is different from the position of the second phase difference pixel p2 in the second basic array pattern P2. The number of pixels t1 (=4) in the vertical direction between the first phase difference pixel p1 and the second phase difference pixel p2 is different from the number of pixels (=6) of the basic array pattern P in the vertical direction and the number of pixels (=3) of each of the A array and the B array in the vertical direction that form the basic array pattern P.

Figure 6:
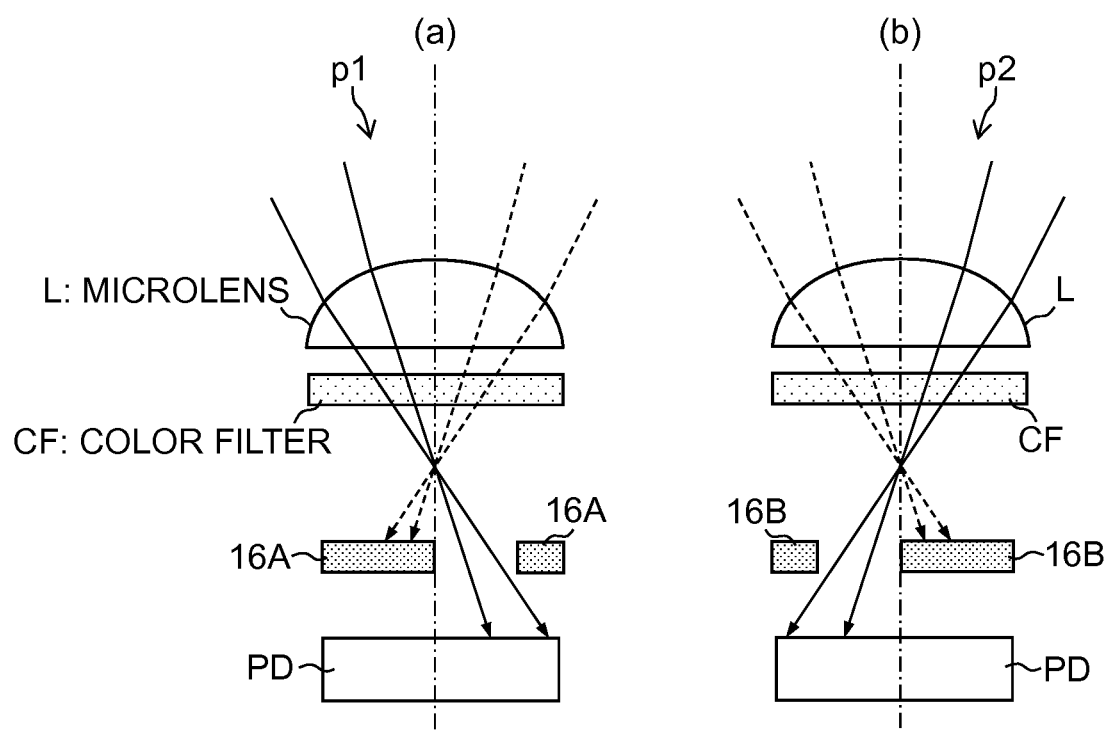
FIG. 6 is a diagram showing examples of configurations of phase difference pixels; an (a) portion shows a first phase difference pixel, and a (b) portion shows a second phase difference pixel.

The portions (a) and (b) of FIG. 6 are enlarged diagrams of the main parts of the first phase difference pixel p1 and the second phase difference pixel p2.

As shown in the portion (a) of FIG. 6, a light shield member 16A is provided on a front side (microlens L side) of a photodiode PD of the first phase difference pixel p1. Meanwhile, as shown in the portion (b) of FIG. 6, a light shield member 16B is provided on the front side of a photodiode PD of the second phase difference pixel p2. The microlens L and the light shield members 16A and 16B have functions as a pupil dividing device. As shown in the portion (a) of FIG. 6, the light shield member 16A shields the left half of the light receiving surface of the photodiode PD. Accordingly, the first phase difference pixel p1 only receives a light flux having passed through the left side with respect to the optical axis in a light flux having passed through the exit pupil of the imaging lens 12. As shown in the portion (b) of FIG. 6, the light shield member 16B shields the right half of the light receiving surface of the photodiode PD of the second phase difference pixel p2. Accordingly, the second phase difference pixel p2 only receives a light flux having passed through the right side with respect to the optical axis in the light flux having passed through the exit pupil of the imaging lens 12. Thus, the microlens L and the light shield members 16A and 16B, which are a pupil dividing device, divide the light flux having passed through the exit pupil into the left and right, which enter the first phase difference pixel p1 and the second phase difference pixel p2, respectively.

Figure 7:
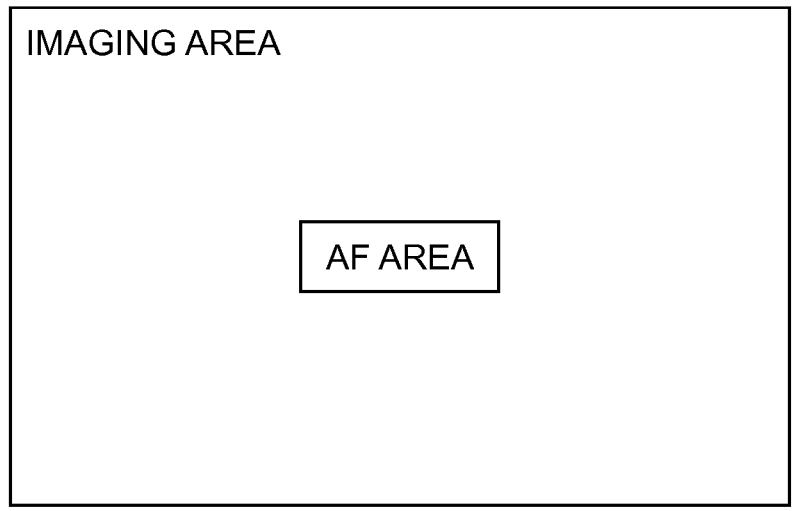
FIG. 7 is a diagram showing an imaging area and an AF area of the image pickup element.

The first phase difference pixel p1 and the second phase difference pixel p2 are provided in an AF area (focal point detection area) at the center in the imaging area of the image pickup element 16 as shown in FIG. 7. It is preferable that about several tens to one hundred of the first phase difference pixels p1 and the second phase difference pixels p2 be arranged in the phase difference detection direction. It is also preferable that multiple pairs of phase difference pixels be arranged in the vertical direction.

Figure 8:
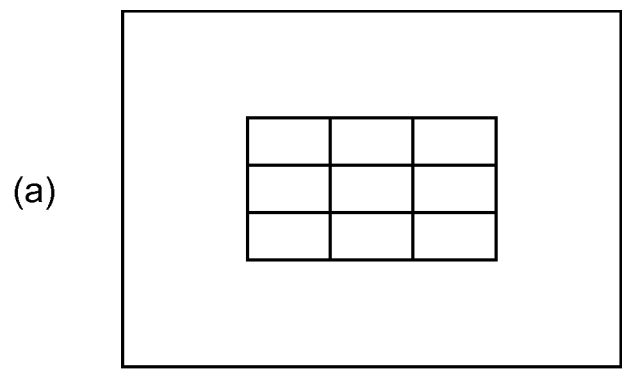
FIG. 8 is a diagram showing another example of an AF area.
Figure 8:
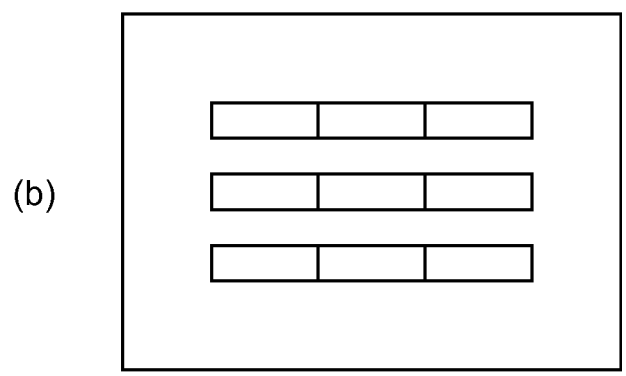
Figure 8:
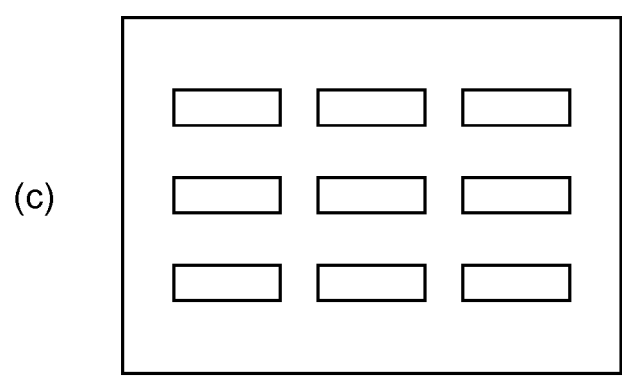

The AF area is not limited to the example shown in FIG. 7. Alternatively, multiple AF areas may be provided in the imaging area as shown in the portions (a) to (c) of FIG. 8, or provided in the entire imaging area.

Returning to FIG. 3, a sensor driver 32 is a color image acquisition device which reads a digital signal (image signal) from the image pickup element 16 according to a reading instruction from the CPU 40, and sequentially reads the image signal from the image pickup element 16 on each pixel line. For instance, when a thinning-reading instruction, such as ¼ thinning, is applied from the CPU 40, the image signal on the pixel line corresponding to the thinning pattern (extraction pattern) described later is selectively read.

The reading scheme for a CMOS image sensor that sequentially resets and sequentially reads each one pixel line from the top is known as a rolling shutter scheme. The rolling shutter scheme has a time difference in exposure timing on each pixel line. This difference causes a problem in that an image of a subject is distorted in the case of a moving subject. Accordingly, when a still image is taken, a shutter driver 33 controls a mechanical shutter 15 to open and close (controls exposure time) to prevent distortion from being caused by a rolling shutter. The rolling shutter scheme is a scheme according to which a MOS type image pickup element performs a sequential exposure operation on each at least one scanning line or a pixel; that is, the scheme sequentially resets each scanning line or pixel to start accumulating an electric charge, and reads the accumulated charge (the scheme is also referred to as the focal plane shutter scheme).

The image signals read from the image pickup element 16 (R, G and B signals) are output to an image input controller 22.

A digital signal processor 24 applies signal processing, such as an offset process, white balance correction, a Gamma correction process, simultaneous processing, and YC processing to the digital image signal input via the image input controller 22, and performs a moving image generating process.

The image data processed by the digital signal processor 24 is input into a VRAM 50. The VRAM 50 includes an A area and a B area each of which stores image data representing one frame of an image. Image data representing one frame of the image is alternately rewritten in the A area and the B area in the VRAM 50. The written image data is read from the area other than the area where image data is being rewritten between the A area and the B area of the VRAM 50.

The image data read from the VRAM 50 is encoded by a video encoder 28, and output to a liquid crystal monitor 30 provided on the rear surface of the camera, thereby allowing a subject image to be continuously displayed on the display screen of the liquid crystal monitor 30.

The CPU 40 always performs an AF operation and an AE (automatic exposure) operation during through image taking/displaying (live view imaging) and during moving image taking/recording (image recording).

An AF processor (a phase difference detection device) 42 is a section of performing a phase difference AF process according to the present invention, and detects the phase difference using each output signal of the phase difference pixel p1 and the second phase difference pixel p2 shown in FIG. 5. The phase difference detection by the AF processor 42 is described later in detail. When phase difference data representing a phase difference is input from the AF processor 42, the CPU 40 functions as a focus adjustment device which performs the phase difference AF process on the basis of the phase difference data. That is, the CPU 40 calculates an amount of deviation (defocus amount) between the focus position by the imaging lens 12 and the imaging plane of the image pickup element 16 on the basis of the phase difference data, and moves the focusing lens in the imaging lens 12 through a lens driver 36 such that the calculated defocus amount becomes zero. The defocus amount may be calculated by the AF processor 42.

An AE detector 44 integrates the G signals over the entire screen, or integrates the G signals weighted with different weights between the center of the screen and the periphery, and outputs the integrated value to the CPU 40. The CPU 40 calculates the brightness (imaging Ev value) of the subject on the basis of the integrated value input from the AE detector 44. If the imaging mode is the still image taking mode, upon first stage pressing of the shutter release button 2 (half pressing), the CPU 40 performs the foregoing AF control again, and, upon full pressing of the shutter release button 2, the CPU 40 calculates the brightness (imaging Ev value) of the subject, determines the F value of the diaphragm 14 and the exposure time (shutter speed) due to the mechanical shutter 15 on the basis of the calculated imaging Ev value according to a program profile, and takes a still image (exposure control).

On the other hand, if the imaging mode is the moving image taking mode, upon full pressing of the shutter release button 2, the CPU 40 starts taking/recording a moving image (image recording). During moving image taking, the mechanical shutter 15 is opened, image data is continuously read from the image pickup element 16 (e.g., with a frame rate of 30 frame/sec., 60 frame/sec.), phase difference AF is continuously performed, the brightness of the subject is calculated, and the shutter speed (charge storage time by the rolling shutter) is controlled by the shutter driver 33 and/or the diaphragm 14 is controlled by the diaphragm driver 34.

The CPU 40 causes the lens driver 36 to advance and retract the zoom lens in the optical axis direction according to a zoom instruction from the zoom button 5 to change the focal length.

Reference numeral 47 designates a ROM (EEPROM) that stores a camera control program, defective information on the image pickup element 16, various parameters and tables used for image processing etc., and thinning patterns for thinning-reading a moving image, etc.

Image data output from the image pickup element 16 during moving image or still image taking is input from the image input controller 22 into the memory (SDRAM) 48, and temporarily stored.

The image data temporarily stored in the memory 48 is appropriately read by the digital signal processor 24, which performs an offset process, white balance correction, a gain control process including sensitivity correction, a Gamma correction process, simultaneous processing (a process of interpolating spatial deviations between color signals according to the arrangement of the primary color filters to convert the color signals into simultaneous system (or also referred to as a demosaic process)), edge enhancing image processing, and a YC process (the process of generating luminance data and color-difference data on the image data); the YC-processed image data (YC data) is stored again in the memory 48. That is, the digital signal processor 24 applies a required signal processing to input mosaic image to generate an RGB pixel signal having entire RGB color information on each pixel, generates image data that includes luminance data (Y data) and color-difference data (Cr, Cb data) on the basis of the RGB pixel signal, and stores this image data in the memory 48.

The YC data stored in the memory 48 is output to a compression and decompression processor 26, subjected to a compression process, such as JPEG (Joint Photographic Experts Group), and subsequently stored in the memory 48 again. An image file is generated from the YC data (compressed data) stored in the memory 48. The image file is read by the media controller 52, and recorded in the memory card 54.

[Phase Difference AF Process]

Figure 9:
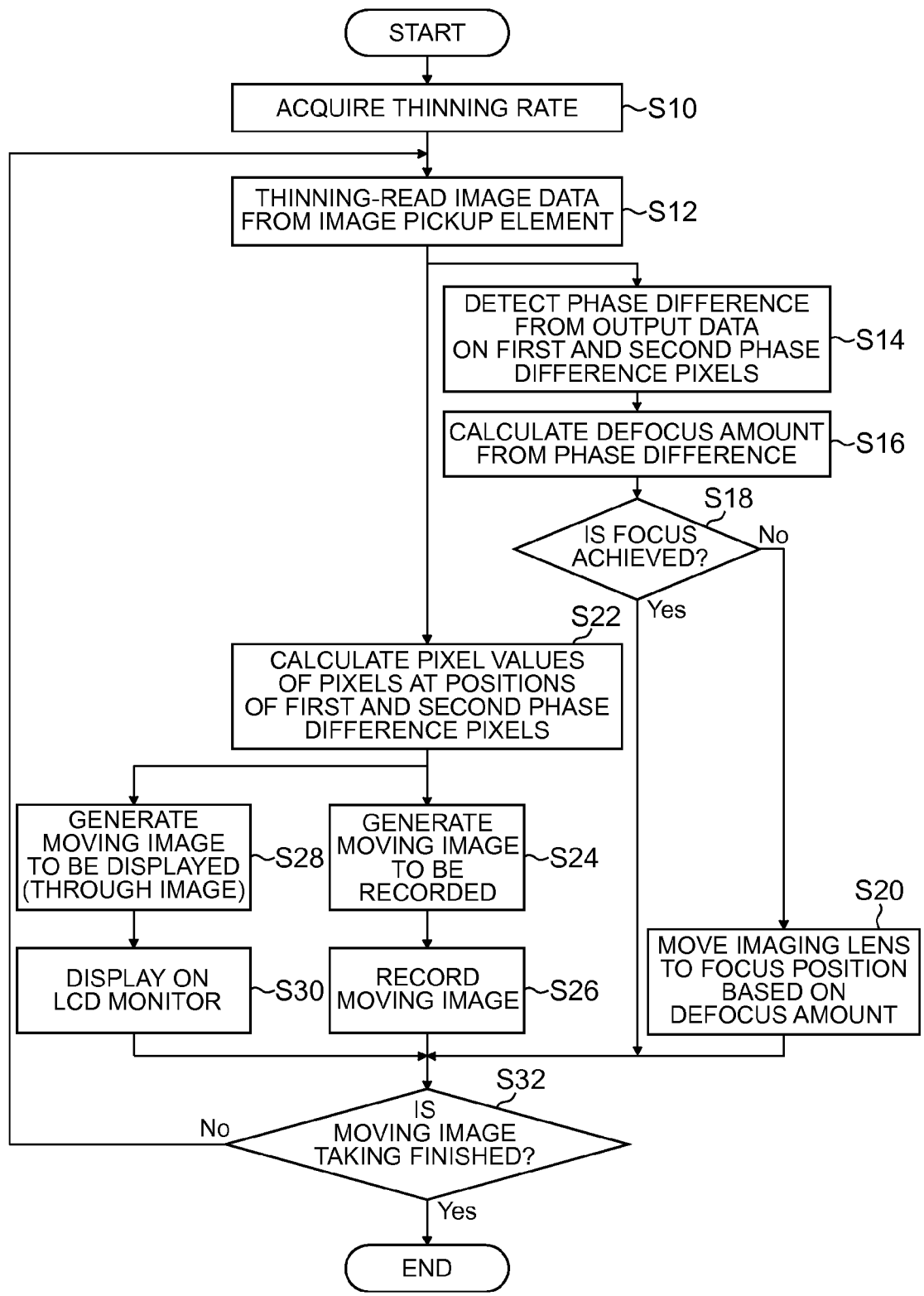
FIG. 9 is a flowchart showing an image processing method according to an embodiment of the present invention.

FIG. 9 is a flowchart showing an image processing method according to the present invention and, in particular, shows image processing during moving image taking.

During moving image taking, the CPU 40 acquires a thinning rate for thinning-reading pixel data (image data) from the image pickup element 16 (step S10 in FIG. 9). The thinning rate may be a preset fixed value, or may be selected by a user from among multiple thinning rates. For instance, the optimal thinning rate can be set in combination with selection of an image size of a moving image or selection of a frame rate.

Subsequently, the CPU 40 outputs an reading instruction of reading a thinning pattern (extraction pattern) according to the thinning rate to the sensor driver 32, and thinning-reads the image data from the image pickup element 16 (step S12).

Figure 10:
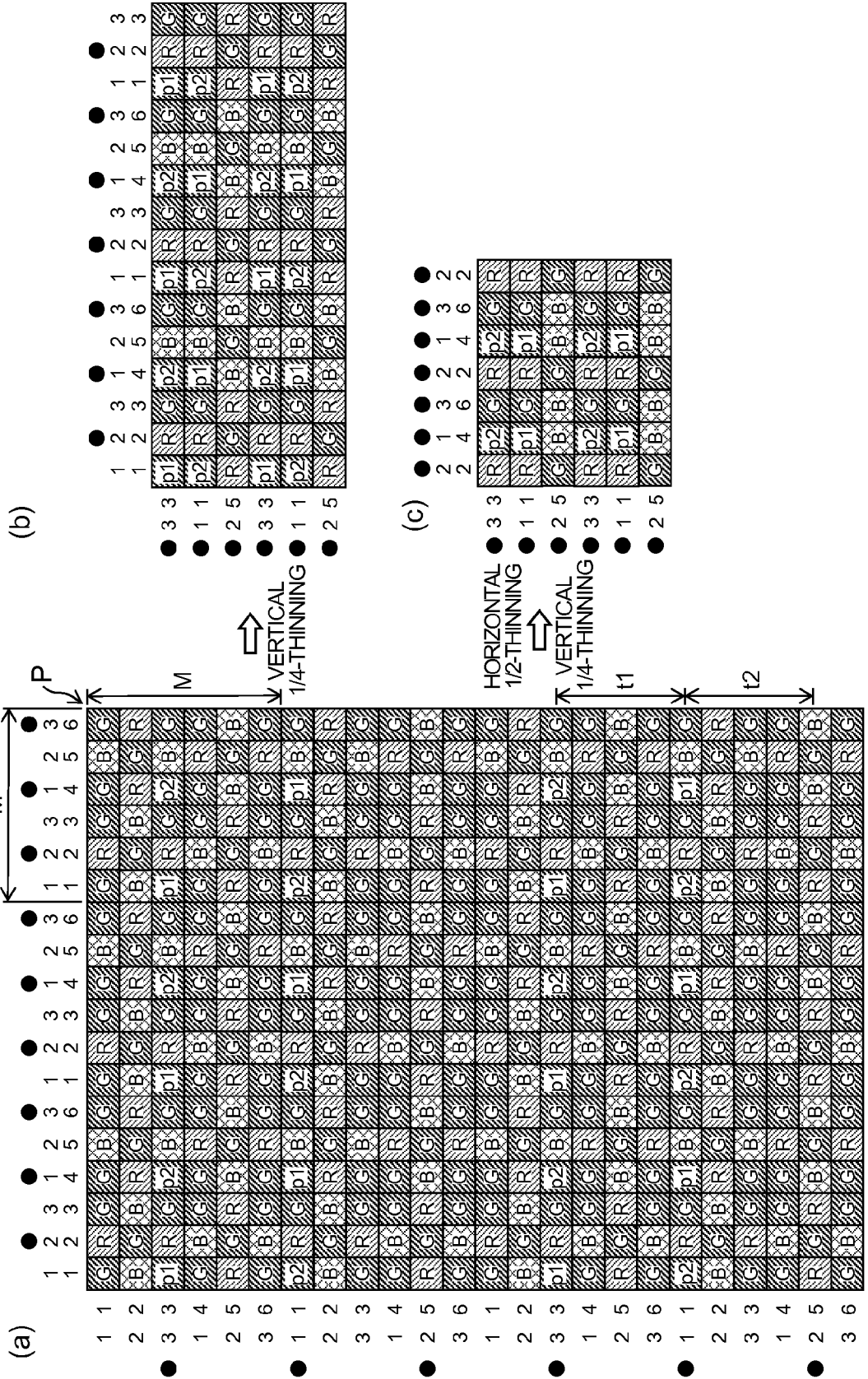
FIG. 10 is a schematic diagram showing a first array example of phase difference pixels and thinning-reading of image data.

FIG. 10 is a schematic diagram that relates to a first array example of phase difference pixels of the image pickup element 16 and thinning-reading of image data.

As shown in the (a) portion of FIG. 10, all lines (all horizontal pixel lines) of RAW data (mosaic image) having the same color array as the color filter array of the image pickup element 16 can be read from the image pickup element 16. During moving image taking, ¼-thinning-reading that extracts and reads one line from every four lines in the vertical direction as shown in the (b) portion of FIG. 10, or ½-thinning-reading that extracts and reads one line from every two lines in the horizontal direction in addition to the ¼-thinning-reading in the vertical direction as shown in the (c) portion of FIG. 10 can be performed. For instance, reading may be switched such that the thinning-reading shown in the (b) portion of FIG. 10 is performed in an imaging mode at a high resolution, and the thinning-reading shown in the (c) portion of FIG. 10 is performed in an imaging mode at a low resolution or a live view display mode.

The first phase difference pixel p1 and the second phase difference pixel p2 are arranged at the positions of lower left G pixels or upper left G pixels in the A array and the B array of 3×3 pixels, respectively (see FIG. 5). During thinning-reading in the vertical direction, both a horizontal pixel line that includes the first phase difference pixel p1 and the second phase difference pixel p2, and a horizontal pixel line that does not include any of the first phase difference pixel p1 and the second phase difference pixel p2 are read. That is, in conformity with the thinning rate, a thinning pattern that indicates lines to be read is preset. In this example, the thinning pattern includes "pixel lines in the horizontal direction" or "pixel lines in the horizontal direction and pixel lines in the vertical direction". Only pieces of pixel data (image data) on pixel lines according to the thinning pattern are thinning-read.

In the (a) portion of FIG. 10, numerals 1 to 3 are assigned to three pixel lines (horizontal direction/vertical direction) corresponding to the A array and the B array (sub-arrays), and numeral 1 to 6 are assigned to six pixel lines corresponding to the basic array pattern P.

The first phase difference pixel p1 and the second phase difference pixel p2 are arranged only on the horizontal pixel lines corresponding to the numeral 1 or 3 in the A array. Accordingly, in the case of the ¼-thinning-reading that only extracts the horizontal pixel lines to which black circles are assigned in the (a) portion of FIG. 10, image data (pixel signal) on "the horizontal pixel line corresponding to numeral 3 in the A array and numeral 3 in the basic array pattern P", "the horizontal pixel line corresponding to numeral 1 in the A array and numeral 1 in the basic array pattern P" and "the horizontal pixel line corresponding to numeral 2 in the B array and numeral 5 in the basic array pattern P" are periodically read as shown in the portion (b) of FIG. 10.

That is, in this example, the line image read and extracted from the image pickup element 16 by the color image acquisition device (the sensor driver 32) includes image data on a pixel line including the first phase difference pixel p1 in the first basic array pattern P1 and extending in the horizontal direction (sub-array numeral 3, basic array pattern numeral 3), image data on a pixel line including the second phase difference pixel p2 in the second basic array pattern P2 and extending in the horizontal direction (sub-array numeral 1, basic array pattern numeral 1), and image data on a pixel line including no first phase difference pixel p1 and no second phase difference pixel p2 and extending in the horizontal direction (sub-array numeral 2, basic array pattern numeral 5). Accordingly, a pixel group (extracted pixel group) that includes pixels corresponding to a thinning-read or extracted pixel signal and corresponds to image data used for generating a moving image, has a configuration where these pixel lines as reading and extraction targets (three horizontal pixel lines in this example) are periodically arranged. In this example, the pixel line that does not include any of the first phase difference pixel p1 and the second phase difference pixel p2 in the extracted pixel group includes pixels (G pixels) having the color identical to the color of the pixels (G pixels) where the first phase difference pixel p1 and the second phase difference pixel p2 are arranged. The G pixels are arranged adjacent to the first phase difference pixel p1 and the second phase difference pixel p2 in the oblique direction.

In this example, thinning is not applied in the horizontal direction and simultaneous processing is performed, and subsequently a process of reducing the pixel data in the horizontal direction is performed, thereby generating moving image data. Accordingly, the digital signal processor 24 extracts and acquires a color image having a prescribed color array, and generates moving image data on the basis of the extracted and acquired color image.

Likewise, in the case of extracting only the horizontal pixel lines (¼-thinning) to which black circles are assigned in the (a) portion of FIG. 10 and the vertical pixel lines (½-thinning), as shown in the (c) portion of FIG. 10, image data (pixel signal) on "the horizontal pixel line corresponding to numeral 3 in the A array and numeral 3 in the basic array pattern P", "the horizontal pixel line corresponding to numeral 1 in the A array and numeral 1 in the basic array pattern P" and "the horizontal pixel line corresponding to numeral 2 in the B array and numeral 5 in the basic array pattern P" is periodically read, and image data (pixel signal) on "the vertical pixel line corresponding to numeral 2 in the A array and numeral 2 in the basic array pattern P", "the vertical pixel line corresponding to numeral 1 in the B array and numeral 4 in the basic array pattern P" and "the vertical pixel line corresponding to numeral 3 in the B array and numeral 6 in the basic array pattern P" is periodically read. Accordingly, in this example, the pixel line (in the horizontal direction) that does not include any of the first phase difference pixel p1 and the second phase difference pixel p2 in the extracted pixel group includes pixels (G pixels) having the color identical to the color of pixels (G pixels) where the first phase difference pixel p1 and the second phase difference pixel p2 are arranged. The G pixels are arranged adjacent to the first phase difference pixel p1 and the second phase difference pixel p2 in the oblique direction.

In this example, the digital signal processor 24 performs simultaneous processing on the basis of extracted pixel data as shown in the (c) portion of FIG. 10, and subsequently, performs a process of reducing pixel data to match degrees of thinning reduction between both the horizontal direction and the vertical direction, thereby generating a moving data.

Thus, the thinning pattern according to the thinning rate has a period (extraction pixel period) in the vertical direction pertaining to line image extraction, and the number of corresponding pixels t2 (=4) of the extraction pixel period in the vertical direction is different from the number of pixels (=6) of the basic array pattern P in the vertical direction. The number of pixels t1 (=4) in the vertical direction between the first phase difference pixel p1 and the second phase difference pixel p2 and the number of corresponding pixels t2 (=4) of the extraction pixel period in the vertical direction satisfy a relationship of t1=t2×l.

The number of pixels (=12) of the first phase difference pixel p1 and the second phase difference pixel p2 corresponding to the repetition period in the vertical direction is a least common multiple (=12) of the number of corresponding pixels t2 (=4) of the extraction pixel period in the vertical direction and the number of pixels (=6) of the basic array pattern P in the vertical direction. Accordingly, the repetition period and the extraction pixel period of the phase difference pixels in the vertical direction does not match with the foregoing kernel period of the G pixels or the kernel periods of the R pixels and the B pixels.

Returning to FIG. 9, after one frame of image data is thinning-read in step S12, the AF operation and a process of generating a moving image are performed in parallel as described below.

The AF processor 42 extracts the image data (output data) on the first phase difference pixel p1 and the second phase difference pixel p2 in the AF area in the thinning-read one frame of image data, and detects the phase difference between the output data on the first phase difference pixel p1 and the output data on the phase difference pixel p2 (step S14). For instance, the phase difference is acquired from the amount of shift in the lateral direction between pieces of output data in the case where the correlation between pieces of output data on the upper/lower pair of the first phase difference pixel p1 and the second phase difference pixel p2 is the maximum (the case where the integrated value of absolute value of difference between pieces of output data on the upper/lower pair of the phase difference pixels).

As shown in the (b) portion of FIG. 10, if the first phase difference pixels p1 and the second phase difference pixels p2 are alternately arranged in the horizontal direction by ¼-thinning-reading, the phase difference is acquired from the amount of shifts in the lateral direction between pieces of output data in the case of maximizing the correlation between the output data on the first phase difference pixel p1 and the second phase difference pixel p2 in the horizontal direction, and the acquired amount of shift corrected by a positional deviation in the horizontal direction between the first phase difference pixel p1 and the second phase difference pixel p2 can be calculated as a phase difference. The method of calculating the phase difference is not limited to the above method. Alternatively, various methods may be applied.

Subsequently, the CPU 40 calculates the amount of deviation (defocus amount) between the focus position according to the imaging lens 12 and the imaging plane of the image pickup element 16 on the basis of the phase difference data from the phase difference detected in step S14 (step S16). The defocus amount may be calculated by the AF processor 42.

The CPU 40 determines whether the focusing lens in the imaging lens 12 is at the focus position or not on the basis of the calculated defocus amount (step S18). If it is determined that the lens is not at the focus position (in the case of "No"), the focusing lens in the imaging lens 12 is moved through the lens driver 36 such that the calculated defocus amount becomes zero (step S20). If it is determined that the lens is at the focus position (in the case of "Yes"), the processing transitions to step S32.

A process of generating a moving image is performed in parallel with the foregoing processes in step S14 to step S20.

After one frame of image data is thinning-read in step S12, in step S22 the pixel values (image data) of the pixels (G pixels) of the first phase difference pixel p1 and the second phase difference pixel p2 are calculated by the interpolating calculation device in the digital signal processor 24. That is, the output data from the first phase difference pixel p1 and the second phase difference pixel p2 cannot be used as image data on the G pixels. Accordingly, the image data on the G pixels at the pixel positions of the first phase difference pixel p1 and the second phase difference pixel p2 is calculated by interpolating image data on adjacent G pixels (multiple G pixels including the adjacent G pixels in this embodiment). The calculated image data is adopted as image data on the G pixels on the pixel positions of the first phase difference pixel p1 and the second phase difference pixel p2.

In the color image having thus thinning-read, pixels having the same color as the color (G) of the pixels at the positions of the first phase difference pixel p1 and the second phase difference pixel p2 are arranged adjacent to the first phase difference pixel p1 and the second phase difference pixel p2. The pixel values of pixels at the positions of the first phase difference pixel p1 and the second phase difference pixel p2 in the thinning-read color image are calculated by the interpolating calculation device (e.g., an interpolating operation circuit) in the digital signal processor 24 using the pixel values of the surrounding pixels including the pixels having the same color (G) adjacent to the first phase difference pixel p1 and the second phase difference pixel p2 for an interpolation process.

Next, the digital signal processor 24 performs the process of generating a moving image to which signal processing, such as white balance correction, a Gamma correction process, simultaneous processing, and YC processing, has been applied, on the basis of the thinning-read (extracted) R, G and B image data (the G pixels at the pixel positions of the phase difference pixels being interpolated image data). At this time, the digital signal processor 24 (a moving image generating device) generates the moving image data reduced on the basis of the color image thinning-read using the values calculated by the interpolating calculation device as the pixel values of the pixels at the positions of the first phase difference pixel p1 and the second phase difference pixel p2 (step S24).

As shown in the (b) portion in FIG. 10 and the (c) portion in FIG. 10, in the R, G and B mosaic image having been thinning-read, many G pixels that are normal pixels are arranged adjacent to the phase difference pixels. Accordingly, the accuracy of interpolation of phase difference pixels can be improved. Furthermore, since the R, G and B pixels are arranged on all the lines in the horizontal direction, the accuracy of the simultaneous processing (demosaic process) can be improved.

The digital signal processor 24 thinning-reads (extracts) the image on the lines in the vertical direction after the simultaneous processing as with the case of thinning-reading of the lines in the horizontal direction (¼-thinning in this example), and generates an image (reduced image) thinning-read in the horizontal direction and the vertical direction.

The moving image generated by the digital signal processor 24 is converted by the compression and decompression processor 26 into compressed moving data, such as in motion JPEG, or MPEG (Moving Picture Experts Group)-4, and subsequently recorded in the memory card 54 via the media controller 52 (step S26).

The digital signal processor 24 generates a moving image to be displayed on the liquid crystal monitor 30 in parallel with generation of the moving image to be recorded (step S28). The moving image to be displayed is an image further reduced in conformity with the display size of the liquid crystal monitor 30. The generated moving image to be displayed is output to the liquid crystal monitor 30 via the video encoder 28, and displayed as a through image (step S30).

The user can verify the image being taken as a moving image by means of the through image displayed on the liquid crystal monitor 30.

Next, the CPU 40 determines whether an instruction of finishing taking the moving image is input from the operation unit 38 (the shutter release button 2 is depressed again) or not (step S32). If the instruction of finishing taking the moving image is input (in the case of "Yes"), the taking/recording the moving image is finished. On the contrary, if the instruction of finishing taking the moving image is not input (in the case of "No"), the processing transitions to step S12 and taking/recording the moving image is continued.

As described above, this embodiment can secure a high simultaneous processing accuracy for the thinning-extracted image used for generating a moving image (the ¼-thinning-read image (only one line is extracted from among four lines) in the vertical direction in the example shown in the (b) portion of FIG. 10, and the ¼-thinning-read image (only one line is extracted from between four horizontal pixel lines) in the vertical direction and the ½-thinning-read image (only one line is extracted from between two vertical pixel lines) in the horizontal direction in the example shown in the (c) portion of FIG. 10), while performing correct AF control efficiently using the phase difference pixels in the extracted image.

That is, since the phase difference pixels (the first phase difference pixel p1 and the second phase difference pixel p2) are included in the line image extracted during moving image generation, AF control can be appropriately performed even during moving image taking. In particular, in the vertical direction, the number of pixels t1 between the first phase difference pixel p1 and the second phase difference pixel p2 and the number of corresponding pixels t2 in the extraction period (extraction pixel period) during moving image generation satisfy "t1=t2×l (l is an integer equal to or greater than one; l=1 in this embodiment)". Accordingly, the phase difference pixels can be efficiently included in the extraction pixel line during moving image generation.

Furthermore, in the vertical direction, the repetition period of the phase difference pixels (the first phase difference pixel p1 and the second phase difference pixel p2) deviates (is different) from the extraction period (extracted pixel period) of the line image during moving image generation. Accordingly, not only the pixel lines including the phase difference pixels but also pixel lines that do not include phase difference pixels but only includes normal pixels are extracted during moving image generation. Thus, the image quality of the moving image can be improved. Furthermore, when the image data on the phase difference pixels is calculated and acquired by an interpolation process on the basis of pixel data therearound, the interpolation accuracy of the image data (pixel data) on "pixel lines that do not include phase difference pixels but only include normal pixels" can be improved. In particular, in this example, the extracted pixel lines that do not include phase difference pixels, and the filters (G filters) having the same color as the color of the phase difference pixels are adjacent to the first phase difference pixels p1 and the second phase difference pixels p2. In the color image (extracted pixel group) after extraction (thinning), pixels having the same color (G pixels) are arranged at positions adjacent to the first phase difference pixels p1 and the second phase difference pixels p2. Accordingly, the interpolation accuracy can be further improved.

By setting the number of pixels t1 (t1=4 in this example) between the first phase difference pixel p1 and the second phase difference pixel p2 that form a pair in the vertical direction to an even number, image processing for these phase difference pixels can be simplified. That is, a primary structure including an amplifier (amplifying unit) provided in the light receiving element of the image pickup element 16 is shared by two pixels adjacent in the vertical direction and two pixels adjacent in the horizontal direction (total 2×2=4 pixels). In this case, a signal processing in consideration of the relative position (arrangement characteristics) of the light receiving element with respect to the primary structure is applied to the signals output from the respective light receiving elements, thereby allowing the image quality to be improved. Thus, the relative positions of the first phase difference pixel p1 and the second phase difference pixel p2 with respect to the primary structure are shared, thereby enabling signal processing in consideration of the arrangement characteristics to be simplified, and allowing the interpolation process accuracy to be improved. Accordingly, in the case of sharing the amplifier and the like between two pixels adjacent to each other in the vertical direction, the pixel interval between the first phase difference pixel p1 and the second phase difference pixel p2 is thus set to an even number of pixels as in this example, and the first phase difference pixel p1 and the second phase difference pixel p2 that form a pair are thus arranged on the same pixel line extending in the vertical direction. Accordingly, the relative positions of the first phase difference pixel p1 and the second phase difference pixel p2 with respect to the primary structure can be shared, thereby enabling the signal processing to be simplified. Here, the pixel interval is an interval (pitch) of pixels from the center point of the reference pixel to the center point of an adjacent pixel.

Furthermore, according to the example shown in the (b) portion of FIG. 10, pixels having all the colors of R pixels, G pixels and B pixels are included in the group of line pixels (thinned) extracted for generating a moving image in each of all horizontal pixel lines. In both cases of the (b) portion of FIG. 10 and the (c) portion of FIG. 10, in the array (extracted pixel group) after thinning-reading, the G pixel and phase difference pixel are adjacent to the R pixel and the B pixel in any direction of the vertical, horizontal and oblique directions, and the R pixels, the G pixels and B pixels do not show a stripe pattern (do not show a state where pixels having only a single color among the R pixels, the G pixels and the B pixels are arranged parallel in the vertical direction). Accordingly, the simultaneous processing accuracy can be improved. This example can therefore generate a moving image that has a high image quality and color reproducibility.

As described above, the imaging device 10 of this embodiment adopts a thinned color image as a target image to be subjected to moving image processing, thereby facilitating reduction of processing time per frame, and preventing the frame rate from decreasing. Furthermore, thinning and reading pixels from the image pickup element 16 can facilitate reduction in time of reading an image from the image pickup element 16.

At least in the AF area in the acquired color image, the first and second phase difference pixels p1 and p2 are arranged at the positions of filters having the same color on the pixel line in the first direction (horizontal direction) on the thinning pattern. Accordingly, the output signals corresponding to the first and second phase difference pixels can be acquired in two dimensions that are in the first direction and the second direction (vertical direction), thereby allowing the phase differences of the output signals to be accurately detected on the basis of the output signals. Thus, in the imaging device 10, phase difference AF can be accurately performed during moving image taking.

Furthermore, at least one of each type of first filters (G filters having the G color) and second filters (R filters and B filters) corresponding to respective colors of second colors (R color and B color) is arranged on each pixel line in the first direction and the second direction in the basic array patterns P and P'. Accordingly, in the case of taking an image (e.g., a still image) using the entire pixels without thinning, occurrence of false color in the taken image (still image etc.) can be reduced and high resolution can be achieved. Moreover, the normal pixels (pixels other than the first and second phase difference pixels) can be arranged as pixels around the first and second phase difference pixels. Accordingly, the pixel values of the color pixels at the positions of the first and second phase difference pixels can be accurately acquired when the values are generated by interpolating the pixel values of the surrounding pixels including adjacent pixels. The imaging device 10 can therefore prevent or alleviate reduction in image quality of the taken image through the phase difference pixels p1 and p2.

[Second Array Example of Phase Difference Pixels]

Figure 11:
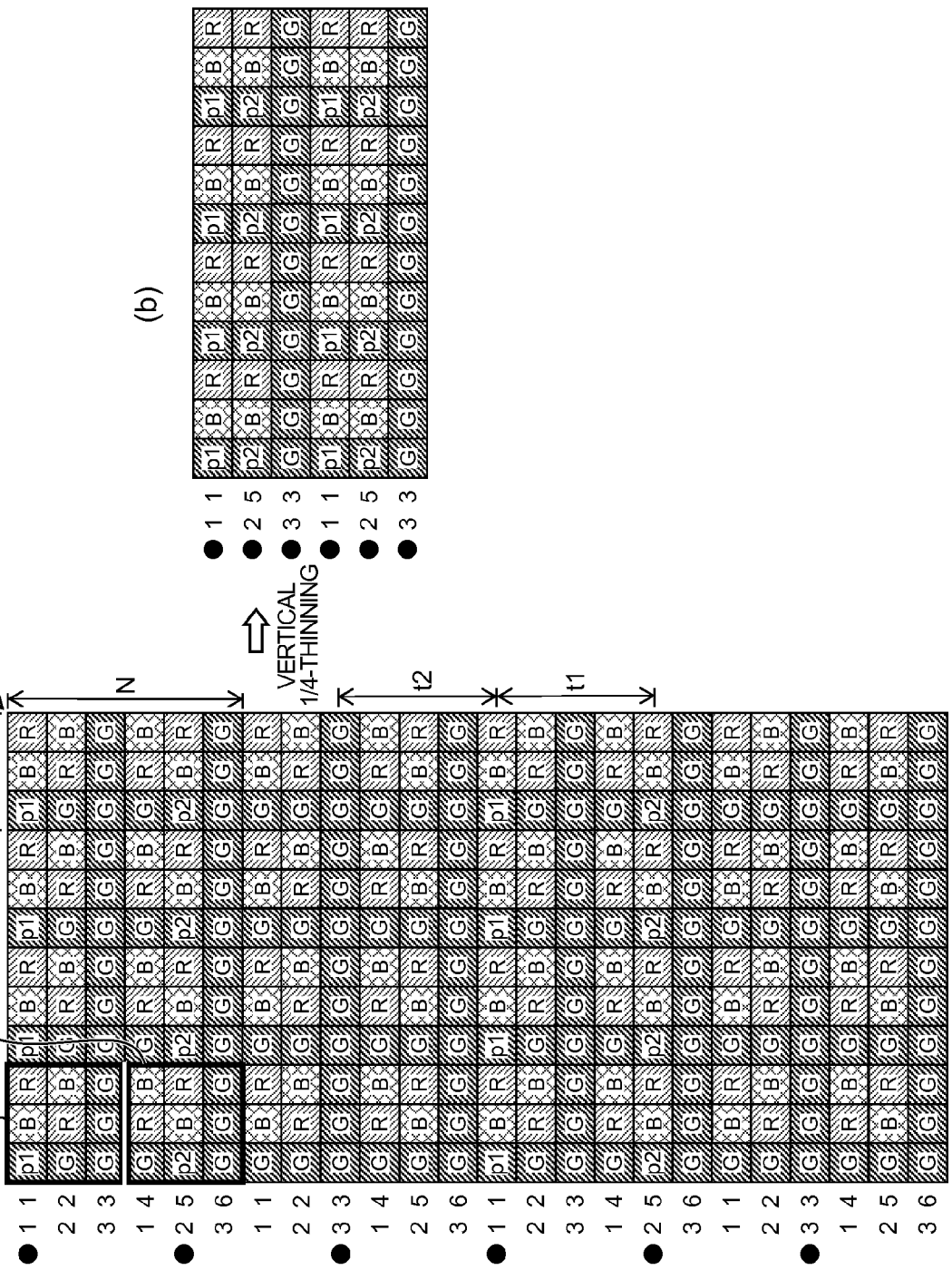
FIG. 11 is a schematic diagram showing a second array example of phase difference pixels and thinning-reading of image data.

FIG. 11 is a schematic diagram showing a second array example of phase difference pixels of the image pickup element 16 and thinning-reading of image data. Note that as to this array example, detailed description of configurations and working effects analogous to those of the first array example shown in FIG. 10 is omitted.

As shown in the (a) portion of FIG. 11, in the color filter array of the image pickup element 16 of this example, the color filters are arranged according to the array pattern corresponding to 3×6 (M×N) pixels in the horizontal direction and the vertical direction to configure the basic array pattern P. This basic array pattern P includes each one of the A array (first sub-array) and the B array (second sub-array), which are two types of sub-arrays where the color filters are arranged according to the array patterns corresponding to 3×3 (M×(N/2)) pixels.

In each of the A array and the B array, five pixels of G filters are arranged at L-shaped peripheral pixel positions that configure two sides adjacent to each other among the four sides, and two pixels of R filters and two pixels of B filters are arranged at pixel positions other than the peripheral portion. In the A array, the R filters are arranged on one diagonal line of 2×2 pixels other than the peripheral portion where the G filters are arranged, and the B filters are arranged on the other diagonal line. In particular, in the A array in this example, the R filters are arranged on the diagonal line passing through the G pixel (G pixel forming a corner among the G pixels arranged in the L-shape) shared by the two sides included in the peripheral portion. Meanwhile, also in the B array, the R filters are arranged on one diagonal line of 2×2 pixels other than the peripheral portion where the G filters are arranged, and the B filters are arranged on the other diagonal line. However, the B filters are arranged on the diagonal line passing through the G pixel shared by the two sides included in the peripheral portion. Accordingly, between the A array and the B array, the positional relationships of the R filters and the B filters are replaced with each other, but the positions of the G filters are the same.

In the color filter array in this example having the foregoing array pattern, the kernel period of the G pixels is a three-pixel period, and the kernel periods of the R pixels and the B pixels are also a three-pixel period. Thus, the kernel period of the G pixels matches with the kernel periods of the R pixels and the B pixels.

As to the arrangement of the phase difference pixels, in the color filter array of this example, the first phase difference pixel p1 is arranged on the upper left G pixel among pixels at the four corners in the A array. The second phase difference pixel p2 is arranged on the G pixel positioned at the center with respect to the vertical direction among the G pixels in the B array. Accordingly, as shown in the (a) portion of FIG. 11, with respect to each of the first phase difference pixel p1 and the second phase difference pixel p2, the G pixels having the same color are arranged on the upper and lower pixels (vertical pixels) and the diagonal pixels (upper left and right pixels or lower left and right pixels). Accordingly, even when a still image is taken without thinning-reading (extracting) a line image, an interpolation process can be accurately applied to image data on these phase difference pixels using image data on the same color pixels around the first phase difference pixels p1 and the second phase difference pixels p2.

The basic array pattern P (first basic array pattern) that includes the first phase difference pixel p1 and the second phase difference pixel p2 and the basic array pattern P (second basic array pattern) that does not include any of the first phase difference pixel p1 and the second phase difference pixel p2 are alternately arranged in the vertical direction. With respect to the horizontal direction, these first basic array pattern and second basic array pattern are continuously arranged.

Accordingly, in the entire color filter array, the G filters arranged at the corners of the A array and the B array encompass an area of 2×2 pixels where the R filters and the B filters are arranged, thereby forming a cross-shaped G filter array. By acquiring the absolute value of the difference between the pixel values of the G pixels in the horizontal direction and the absolute value of the difference between the pixel values of the G pixels in the vertical direction among the crossing portion of the G pixels that form the cross-shaped array, it can be determined that correlation is in a direction having a small absolute value of the difference between the values in the horizontal direction and the vertical direction. Furthermore, by acquiring the absolute value of the difference between the pixel values of the G pixels in the oblique directions (NE, NW) among the crossing portion, it can be determined that correlation is in a direction having a small absolute value of the difference between the oblique directions. As a result, according to the color filter array, through use of information (output signal) on the G pixels at the minimum pixel interval, the highly correlating direction can be determined among the horizontal direction, the vertical direction and the oblique directions (the pixel interval described here is a pixel interval (pitch) from the center point of the reference pixel to the center point of the adjacent pixel). This determination result on the direction can be used for a process (simultaneous processing) of interpolation from adjacent pixels. In this case, for instance, it is preferable that a direction determining processor be provided in the foregoing simultaneous processing circuit, and this direction determining processor determine the direction.

Preferably, the R filters and the B filters are arranged on the lines of the color filter array in the horizontal direction (H) and the vertical direction (V) in the basic array pattern P in order to reduce occurrence of color moire (false color). However, the R and B pixel values at the G pixels can be acquired by applying an interpolation process to pixels corresponding to the R filter and the B filter in the adjacent filter strings using a result of determining the direction on the basis of the foregoing group of adjacent G filters and the like.

In this color filter array, the first phase difference pixel p1 and the second phase difference pixel p2 are arranged as a pair on the same pixel line extending in the vertical direction, and can be utilized as a pair. Also in this example, the number of pixels t1 with respect to the vertical direction between the first phase difference pixel p1 and the second phase difference pixel p2 that form a pair in the vertical direction is "4". The repetition periods of the first phase difference pixel p1 and the second phase difference pixel p2 in the vertical direction is determined with reference to the two basic array patterns P, and the specific number of corresponding pixels is "12".

In the above array configuration, a process of extracting a line image during moving image generation is performed, as described later.

Also in this example, all lines of RAW data (mosaic image) having the same color array as that of the color filter array of the image pickup element 16 can be read from the image pickup element 16. During moving image taking, as shown in the (b) portion of FIG. 11, ¼-thinning reading (extraction) that thinning-reads one line from among every four lines can be performed.

During thinning-reading, only image data on lines corresponding to the thinning pattern is read. The image data (pixel data) is read from lines that include the first phase difference pixels p1, lines that include the second phase difference pixels p2, and lines that do not include any of the first phase difference pixel p1 and the second phase difference pixel p2. That is, the image data (line image) on "horizontal pixel lines that include the first phase difference pixels p1 (numeral 1 in the A array, numeral 1 in the basic array pattern)", "horizontal pixel lines that include the second phase difference pixels p2 (numeral 2 in the B array, numeral 5 in the basic array pattern)" and "horizontal pixel lines that do not include any of the first phase difference pixels p1 and the second phase difference pixels p2 (numeral 3 in the A array, numeral 3 in the basic array pattern)" is periodically read at four-pixel intervals in the vertical direction.

Image lines (numeral 3 in the basic array pattern) that do not include any of the first phase difference pixels p1 and the second phase difference pixels p2 in the extracted pixel group in this example shown in the (b) portion of FIG. 11 only include the pixels (G pixels) having the same color as that of the G pixels arranged on the first phase difference pixels p1 and the second phase difference pixels p2, and the first phase difference pixels p1 and the second phase difference pixels p2 are adjacent to these G pixels.

As described above, also in this example, since the phase difference pixels (the first phase difference pixels p1 and the second phase difference pixels p2) are included in the line image extracted during moving image generation, AF control can be appropriately performed even during moving image taking. In particular, in the vertical direction, the number of pixels t1 between the first phase difference pixel p1 and the second phase difference pixel p2 and the number of corresponding pixels t2 in the extraction period (extraction pixel period) of the line image during moving image generation satisfy "t1=t2×1 (1 is an integer equal to or greater than one; 1=1 in this example)". Accordingly, the periodically arranged phase difference pixels can be efficiently included in the extraction pixel line during moving image generation.

Not only pixel lines that include phase difference pixels but also pixel lines that do not include phase difference pixels and only include normal pixels are extracted during moving image generation. Accordingly, the interpolation accuracy of image data (pixel data) can be improved. In particular, the extracted pixel lines that do not include phase difference pixels include the filters (G filters) having the same color as that of the phase difference pixels. In the color image (extracted pixel group) after extraction (thinning-read), normal pixels (G pixels) having the same color are arranged at positions (vertically adjacent positions and obliquely adjacent positions) adjacent to the first phase difference pixels p1 and the second phase difference pixels p2. Accordingly, the interpolation accuracy can be further improved.

[Third Array Example of Phase Difference Pixels]

Figure 12:
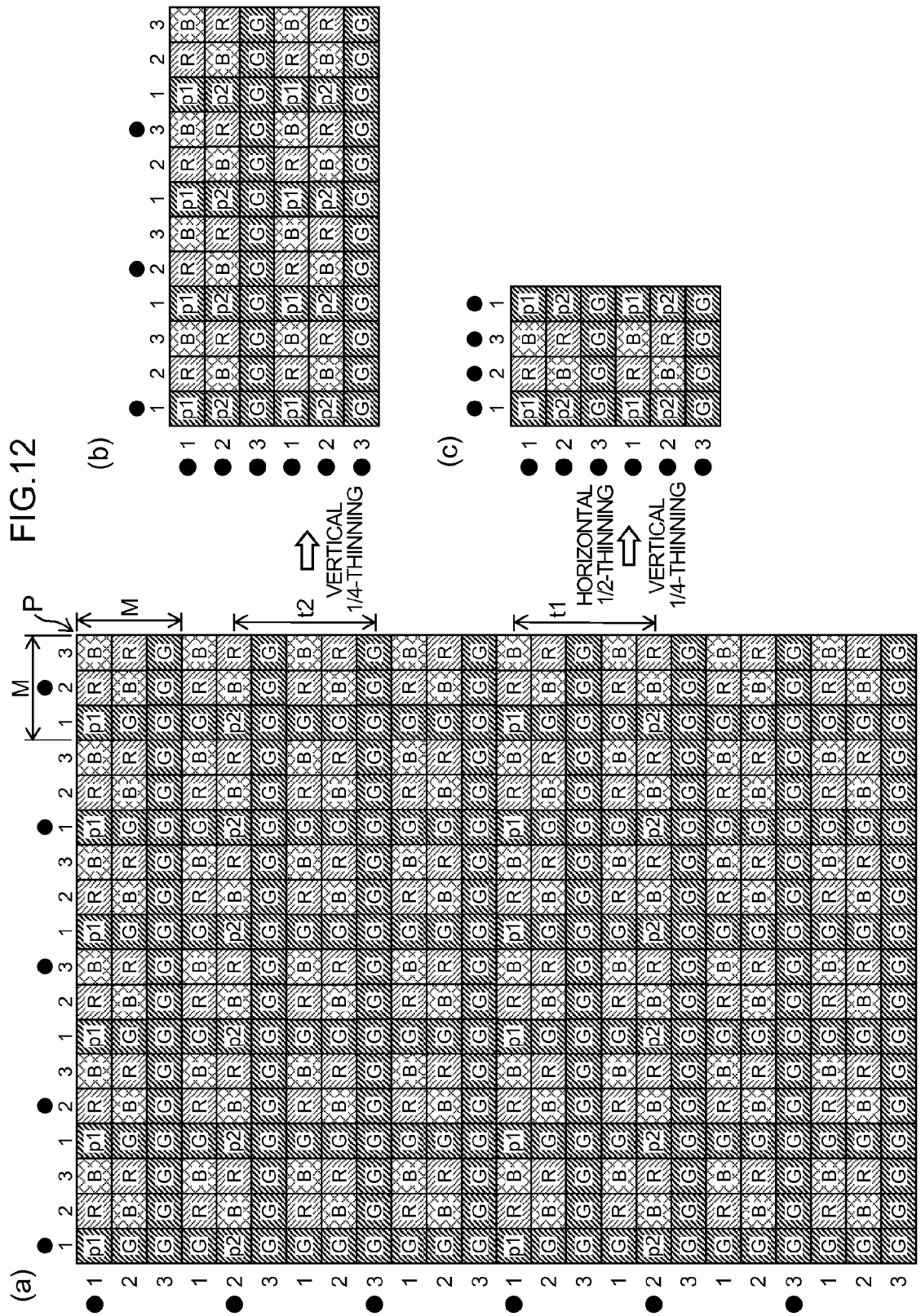
FIG. 12 is a schematic diagram showing a third array example of phase difference pixels and thinning-reading of image data.

FIG. 12 is a schematic diagram showing a third array example of phase difference pixels of the image pickup element 16 and thinning-reading of image data. Note that as to this array example, detailed description of configurations and working effects analogous to those of the first array example shown in FIG. 10 and the second array example shown in FIG. 11 is omitted.

As shown in the (a) portion of FIG. 12, in the color filter array of the image pickup element 16 of this example, the color filters are arranged according to the array pattern corresponding to 3×3 (M×N) pixels in the horizontal direction and the vertical direction to configure the basic array pattern P.

This basic array pattern P has a color filter array analogous to the B array of the second array example shown in FIG. 11 as described above. That is, five pixels of G filters are arranged at L-shaped peripheral pixel positions that configure two sides adjacent to each other among the four sides of the basic array pattern P, and two pixels of R filters and two pixels of B filters are arranged at pixel positions other than the peripheral portion. In particular, in the basic array pattern P in this example, the B filters are arranged on the diagonal line passing through the G pixel (G pixel forming a corner among the G pixels arranged in the L-shape) shared by the two sides included in the peripheral portion, and the R filters are arranged on the other diagonal line at the positions of 2×2 pixels other than the peripheral portion where the G filters are arranged.

In the color filter array where the basic array patterns P are arranged in the horizontal direction and the vertical direction, the kernel period of the G pixels is a three-pixel period, and the kernel periods of the R pixels and the B pixels are also a three-pixel period. Thus, the kernel period of the G pixels matches with the kernel periods of the R pixels and the B pixels.

As to the arrangement of the phase difference pixels, in the color filter array of this example, one basic array pattern P where the first phase difference pixel p1 is arranged, another basic array pattern P where the second phase difference pixel p2 is arranged, and two basic array patterns P where the first phase difference pixel p1 and the second phase difference pixel p2 are not arranged are arranged in the vertical direction. Accordingly, as shown in the (a) portion of FIG. 12, with respect to each of the first phase difference pixel p1 and the second phase difference pixel p2, the G pixels having the same color are arranged on the upper and lower pixels (vertical pixels) and the diagonal pixels (upper left and right pixels or lower left and right pixels). Accordingly, even when a still image is taken without thinning-reading (extracting) a line image, an interpolation process can be accurately applied to image data on these phase difference pixels using image data on the same color pixels around the first phase difference pixels p1 and the second phase difference pixels p2.

The first phase difference pixel p1 is arranged on the upper left G pixel among the four corners of the basic array pattern P. The second phase difference pixel p2 is arranged on a G pixel positioned at the center in the vertical direction among the G pixels in the basic array pattern P. The two basic array patterns P that include the first phase difference pixel p1 and the second phase difference pixel p2 and the two basic array patterns P that do not include any of the first phase difference pixel p1 and the second phase difference pixel p2 are alternately arranged in the vertical direction. With respect to the horizontal direction, these basic array patterns P are continuously arranged.

Accordingly, in the entire color filter array, the G filters arranged at the corners of the basic array pattern P encompass an area of 2×2 pixels where the R filters and the B filters are arranged, thereby forming a cross-shaped G filter array.

In this color filter array, the first phase difference pixel p1 and the second phase difference pixel p2 are arranged as a pair on the same pixel line extending in the vertical direction, and can be utilized as a pair. Thus, the number of pixels t1 in the vertical direction between the first phase difference pixel p1 and the second phase difference pixel p2 that form the pair in the vertical direction is "4". The repetition period of the first phase difference pixel p1 and the second phase difference pixel p2 in the vertical direction is with reference to the four basic array patterns P. The specific number of corresponding pixels is "12".

In the above array configuration, a process of extracting a line image during moving image generation is performed, as described later.

Also in this case, all lines of RAW data (mosaic image) having the same color array as that of the color filter array of the image pickup element 16 can be read from the image pickup element 16. During moving image taking, ¼-thinning-reading (extraction) that thinning-reads one line from every four lines in the vertical direction as shown in the (b) portion of FIG. 12, or ¼-thinning-reading (extraction) that thinning-reads one line from every four lines in the horizontal direction in addition to the ¼-thinning-reading in the vertical direction as shown in the (c) portion of FIG. 12 can be performed.

During thinning-reading, only image data on lines corresponding to the thinning pattern is read. The image data (pixel data) is read from lines that include the first phase difference pixels p1, lines that include the second phase difference pixels p2, and lines that do not include any of the first phase difference pixel p1 and the second phase difference pixel p2. That is, in the example shown in the (b) portion of FIG. 12, the image data (line image) on "horizontal pixel lines that include the first phase difference pixels p1 (numeral 1 in the basic array pattern)", "horizontal pixel lines that include the second phase difference pixels p2 (numeral 2 in the basic array pattern)" and "horizontal pixel lines that do not include any of the first phase difference pixels p1 and the second phase difference pixels p2 (numeral 3 in the basic array pattern)" is periodically read at four-pixel intervals in the vertical direction. In this example, thinning is not applied in the horizontal direction and simultaneous processing is performed, and subsequently a process of reducing the pixel data in the horizontal direction is perform, thereby generating moving image data. In the example shown in the (c) portion of FIG. 12, in addition to these horizontal pixel lines, image data (line image) on "vertical pixel lines that include the first phase difference pixels p1 and the second phase difference pixels p2 (numeral 1 in the basic array pattern)", "vertical pixel lines corresponding to numeral 2 in the basic array pattern" and "vertical pixel lines corresponding to numeral 3 in the basic array pattern" is periodically read at four-pixel intervals in each of the vertical direction and the horizontal direction.

The horizontal pixel lines that do not include any of the first phase difference pixels p1 and the second phase difference pixels p2 in the extracted pixel group in this example shown in the (b) portion of FIG. 12 and the (c) portion of FIG. 12 only include the pixels (G pixels) having the same color as that of the G pixels arranged on the first phase difference pixels p1 and the second phase difference pixels p2.

The extracted pixel group shown in the (b) portion of FIG. 12 and the (c) portion of FIG. 12 relate to the array pattern of the R filters, the G filters and the B filters, and has the same array pattern as the basic array pattern P shown in the (a) portion of FIG. 12. Accordingly, before and after moving image generation, a common image processing (interpolation process) can be applied, and the convenience is significantly high.

As described above, also in this example, since the phase difference pixels (the first phase difference pixels p1 and the second phase difference pixels p2) are included in the line image extracted during moving image generation, AF control can be appropriately performed even during moving image taking. In particular, in the vertical direction, the number of pixels t1 between the first phase difference pixel p1 and the second phase difference pixel p2 and the number of corresponding pixels t2 in the extraction period (extraction pixel period) of the line image during moving image generation satisfy "t1=t2×l (l is an integer equal to or greater than one; l=1 in this example)". Accordingly, the periodically arranged phase difference pixels can be efficiently included in the extraction pixel line during moving image generation.

Not only pixel lines that include phase difference pixels but also pixel lines that do not include phase difference pixels and only include normal pixels are extracted during moving image generation. Accordingly, the interpolation accuracy of image data (pixel data) can be improved. Particularly in this example, the extracted pixel lines in the horizontal direction that do not include phase difference pixels only include the filters (G filters) having the same color as that of the phase difference pixels and pixels (G pixels). In the color image (extracted pixel group) after extraction (thinning-read), at positions (vertically adjacent positions and obliquely adjacent positions) adjacent to the first phase difference pixels p1 and the second phase difference pixels p2, normal pixels (G pixels) having the same color (G color) on the extraction pixel lines that do not include the phase difference pixels are arranged. Accordingly, the interpolation accuracy can be further improved.

The image data that includes the group of line pixels extracted (thinning-read) for generating a moving image has the same array pattern as the basic array pattern P of the mosaic image data to which the extraction process has not been applied yet. Accordingly, before and after moving image generation, the common image processing (interpolation process) can be applied.

Furthermore, according to this example, in the group of line pixels extracted (thinning-read) for moving image generation, as to the R pixels and the B pixels, pixels having the same color are not arranged at adjacent pixel positions, but pixels having another color are arranged instead. For instance, the G pixel and the B pixel are adjacent to the R pixel, and the G pixel and the B pixel are adjacent to the B pixel. Accordingly, in this example, the accuracy of the interpolation process (simultaneous processing) during moving image generation can be effectively improved.

Another Embodiment

Another Embodiment of Image Pickup Element Having Pixels Other than R, G and B

In each of the foregoing embodiments, the description has been made, exemplifying the G filters having the G color as the first filters having the first color. Alternatively, instead of the G filters, or instead of some of the G filters, filters that satisfy any of the following condition (1) to condition (4) may be adopted.

<Condition of First Filter (First Color)>
[Condition (1)]

The condition (1) is that the contribution ratio for acquiring a luminance signal is at least 50%. The contribution ratio of 50% is a value defined so as to discriminate the first color (G color or the like) of the present invention from the second colors (colors of R, B, etc.), and is a value defined such that a color having a relatively higher contribution ratio for acquiring luminance data than the R color, the B color, etc. have is included in the "first color".

The image signal of the G pixels has a higher contribution ratio during generation of the luminance signal than image signals of the R pixels and the B pixels have. More specifically, the luminance signal (Y signal) of a certain pixel after simultaneous processing is generally calculated by the following expression on the basis of simultaneous-processed R, G and B image signals (R, G and B signals).

$$Y=0.3R+0.6G+0.1B \qquad \text{[Expression 1]}$$

According to this [Expression 1], the contribution ratio of G color is 60%. Accordingly, the G color has a higher contribution ratio than the R color (contribution ratio of 30%) and the B color (contribution ratio of 10%) have. Thus, the G color is a color that most contributes to the luminance signal among the three primary colors.

Furthermore, the contribution ratios of colors other than the G color can be also acquired by an experiments or simulation. Accordingly, a filter with a color that is other than the G color and has a contribution ratio of at least 50% may be adopted as the first filter of the present invention. Note that colors having contribution ratios less than 50% may be adopted as the second colors of the present invention (R color, B color, etc.). The filter having this color is adopted as the second filter of the present invention.

[Condition (2)]

The condition (2) is that the peak of the transmittance of the filter is a wavelength within a range from 480 nm to 570 nm. For instance, a value measured by a spectrophotometer is used as the transmittance of the filter. This wavelength range is a range defined so as to discriminate the first color of the present invention (G color) from the second colors (R, B color, etc.), and is a range defined so as not to include the peaks of the R color and the B color where the foregoing contribution ratios are relatively low but so as to include the peak of the G color where the contribution ratio is relatively high. Accordingly, a filter whose peak of the transmittance is a wavelength within the range from 480 nm to 570 nm can be used as the first filter. Note that filters whose peaks of the transmittance are wavelengths within a range from 480 nm to 570 nm can be used as the second filters of the present invention (R filter, B filter).

[Condition (3)]

The condition (3) is that the transmittance at a wavelength within a range from 500 nm to 560 nm is higher than the transmittance of the second filters (R filter and B filter). Also with this condition (3), for instance, a value measured by a spectrophotometer is used as the transmittance of the filter. This wavelength range of this condition (3) is also a range defined so as to discriminate the first color of the present invention (G color or the like) from the second color (R, B color, etc.), and is a range where the transmittance of the filter with a color having a relatively higher contribution ratio than the R color and the B color have is higher than the transmittances of the R and B filters. Accordingly, a filter having a relatively high transmittance at a wavelength within the range from 500 nm to 560 nm can be used as the first filter, and filters having relatively low transmittances can be used as the second filters.

[Condition (4)]

The condition (4) is that filters having at least two colors that are a color (e.g., G color among RGB) most contributing to the luminance signal among the three primary colors and a color different from the three primary colors are used as first filters. In this case, a filter corresponding to a color other than the colors of the first filters is adopted as the second filter.

<Transparent Filter (W Filter)>

In the foregoing embodiments, the color filters that include color filters corresponding mainly to RGB are described. Some of these color filters may be transparent filters (W filters corresponding to white pixels). In particular, it is preferable that W filters be arranged instead of some of the first filters (G filters). Such replacement of some of the G pixels with the white pixels can suppress degradation of the color reproducibility even if the pixel size is fined.

The W filter is a transparent color (first color) filter. The W filter allows light corresponding to a wavelength range of visible light to pass and, for instance, is a filter whose transmittances of light with RGB colors are at least 50%. The W filter has a transmittance higher than the G filter does. Accordingly, the contribution ratio for acquiring the luminance signal is higher than the ratio of G color (60%), and satisfies the foregoing condition (1).

Figure 13:
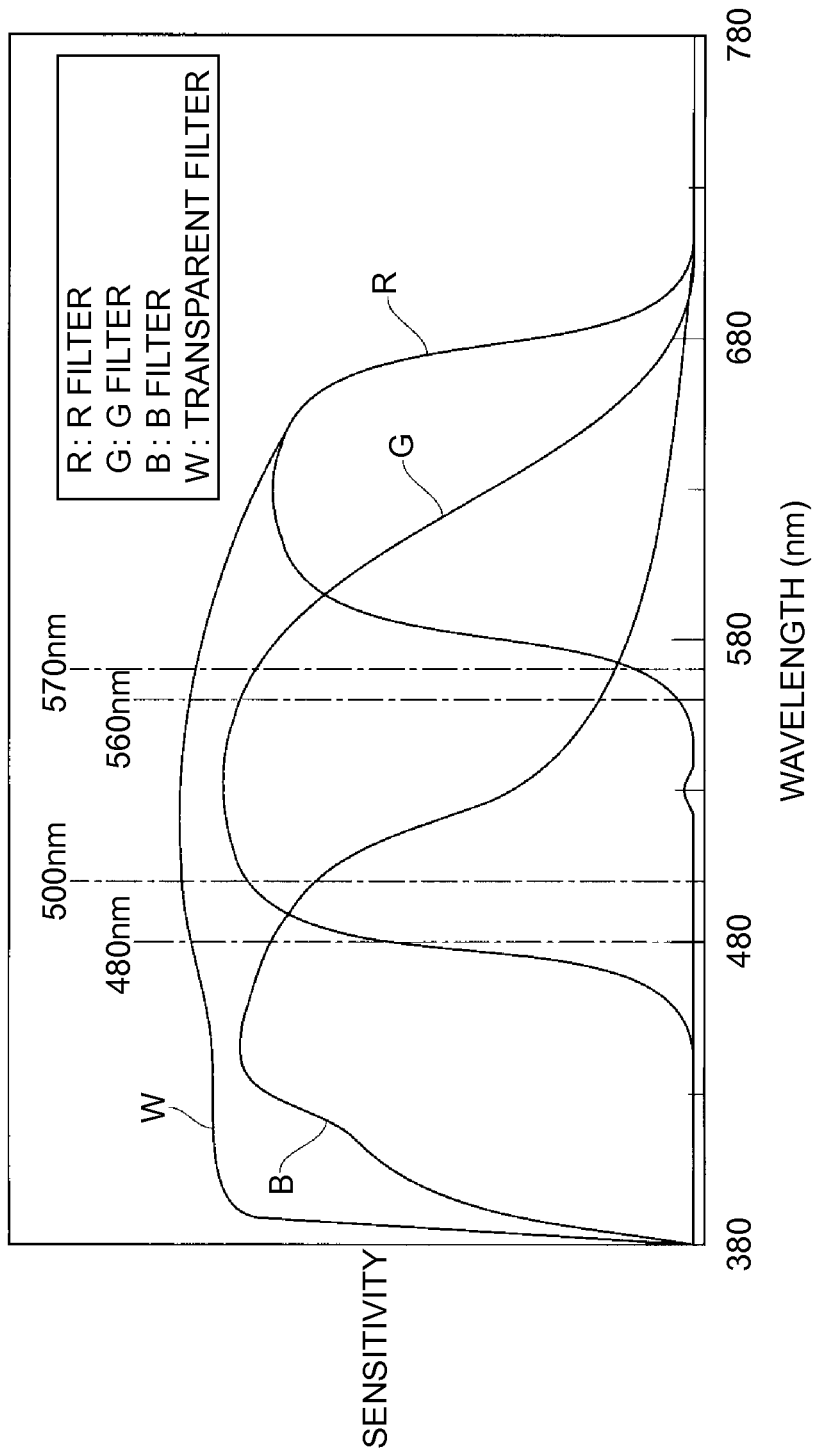
FIG. 13 is a graph showing an example of spectral sensitivity characteristics of photodiodes on which R filters, G filters, B filters and transparent filters are arranged.

FIG. 13 is a graph showing an example of spectral sensitivity characteristics of photodiodes on which R filters, G filters, B filters and transparent filters are arranged.

In FIG. 13 showing the spectral sensitivity characteristics of the color filter array (light receiving element), the peak of the transmittance of the W filter (the peak of sensitivity of white pixel) is within a range from 480 nm to 570 nm. The transmittance of the W filter is higher than the transmittances of the R and B filters at a wavelength within a range from 500 nm to 560 nm. Thus, the W filter also satisfies the foregoing conditions (2) and (3). Note that as with the W filter, the G filter also satisfies the foregoing conditions (1) to (3).

Since the W filter thus satisfies the foregoing conditions (1) to (3), the W filter can be adopted as the first filter of the present invention. In the color filter array, some of the G filters corresponding to a G color most contributing to the luminance signal among three RGB primary colors are thus replaced with the W filters. Accordingly, this array also satisfies the foregoing condition (4).

<Multiple Types of First Filter (G Filter)>

The G filter with the G color as the first filter is not limited to one type. For instance, multiple types of G filters can be adopted as the first filters. That is, the G filters of the color filters (basic array pattern) according to the foregoing embodiments may be appropriately replaced with G1 filters and G2 filters.

Figure 14:
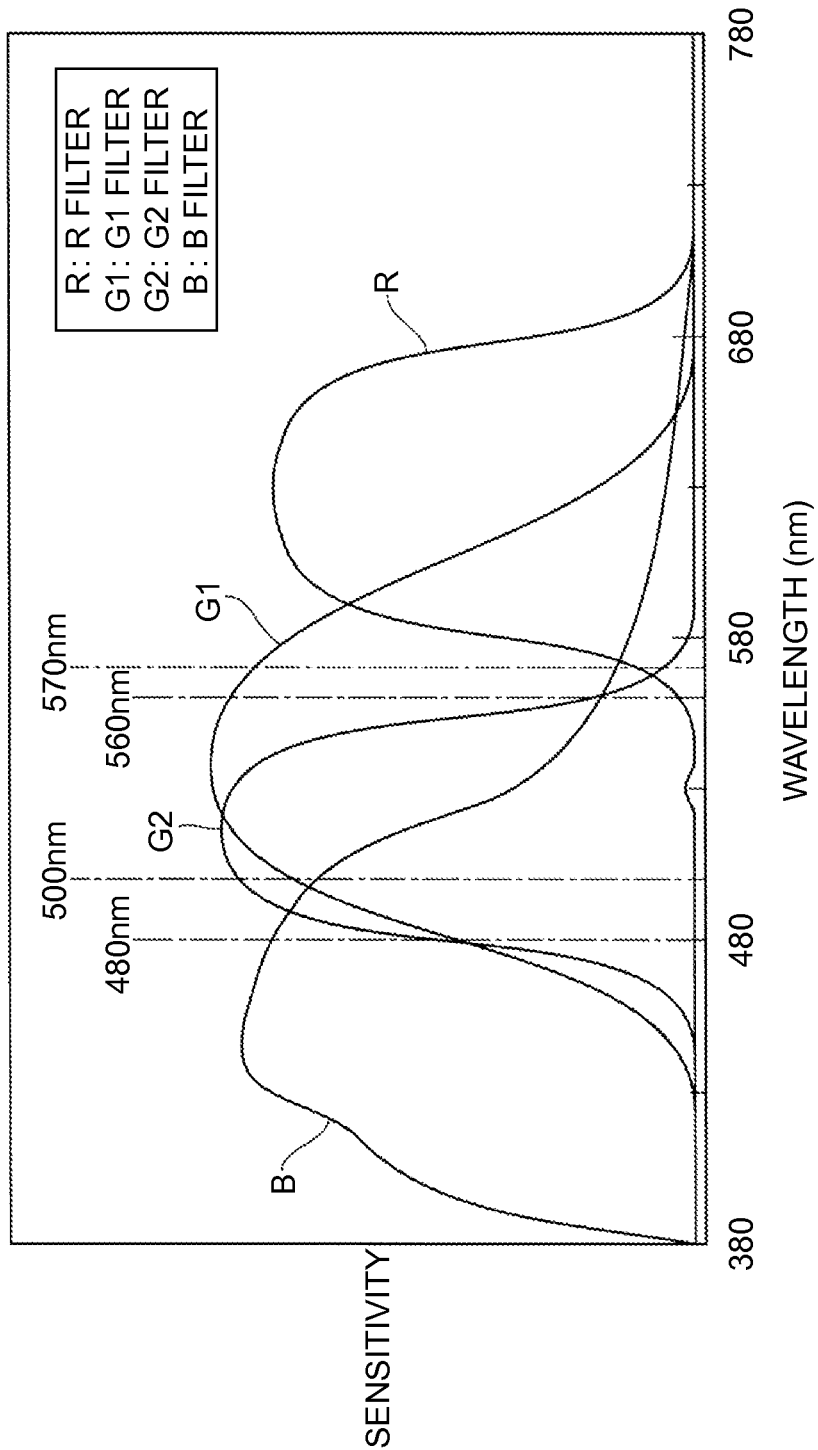
FIG. 14 is a graph showing an example of spectral sensitivity characteristics of photodiodes on which R filters, G1 filters, G2 filters and B filters are arranged.

FIG. 14 is a graph showing an example of spectral sensitivity characteristics of photodiodes on which R filters, G1 filters, G2 filters and B filters are arranged. The G1 filter allows G light in a first wavelength band to pass. The G2 filter allows G light in a second wavelength band highly correlated with that of the G1 filter to pass.

The existing G filter (e.g. the G filter in the first embodiment) can be adopted as the G1 filter. A filter highly correlated with the G1 filter can be adopted as the G2 filter. In this case, it is preferable that the peak value of the spectral sensitivity curve of the light receiving element on which the G2 filters be arranged, for instance, at a wavelength within a range from 500 nm to 535 nm (around the peak value of the spectral sensitivity curve of the light receiving element on which the existing G filters are arranged). Note that, for instance, the method described in Japanese Patent Application Laid-Open No. 2003-284084 is used as the method of defining the color filters with the four colors (R, G1, G2 and B).

The colors of the image acquired by the color image pickup element are thus configured to be four types, and color information to be acquired is increased, thereby allowing colors to be represented more correctly in comparison with the case of acquiring only three types of colors (RGB). That is, colors look different through the eye can be reproduced as different colors, and colors look the same can be reproduced as the same colors (improvement in "color discriminability").

The transmittances of the G1 and G2 filters are basically the same as the transmittance of the G filter of the first embodiment. Accordingly, the contribution ratio for acquiring the luminance signal becomes higher than 50%. The G1 and G2 filters thus satisfy the foregoing condition (1).

In FIG. 14 showing the spectral sensitivity characteristics of the color filter array (light receiving element), the peaks of the transmittances of the G1 and G2 filters (the peaks of sensitivities of the G pixels) is at a wavelength within a range from 480 nm to 570 nm. The transmittances of the G1 and G2 filters are higher than the transmittances of the R and B filters at a wavelength within a range from 500 nm to 560 nm. Thus the G1 and G2 filters also satisfy the foregoing conditions (2) and (3).

Note that the arrangements and the numbers of G1 and G2 filters may be appropriately changed. The number of types of G filters may be three or more.

<Emerald Filter (E Filter)>

The foregoing embodiments describe the color filters that mainly include color filters having colors corresponding to RGB colors. Alternatively, some of the filters having these colors may be replaced with filters with other colors. For instance, filters (E filters corresponding to E pixels) corresponding to an emerald (E) color may be adopted. In particular, it is preferable that E filters be arranged instead of some of the first filters (G filters). Such use of the color filter array with four colors where some of the G filters are replaced with the E filters can improve the reproducibility of a high range component of luminance, reduce jagginess, and improve a sense of resolution.

Figure 15:
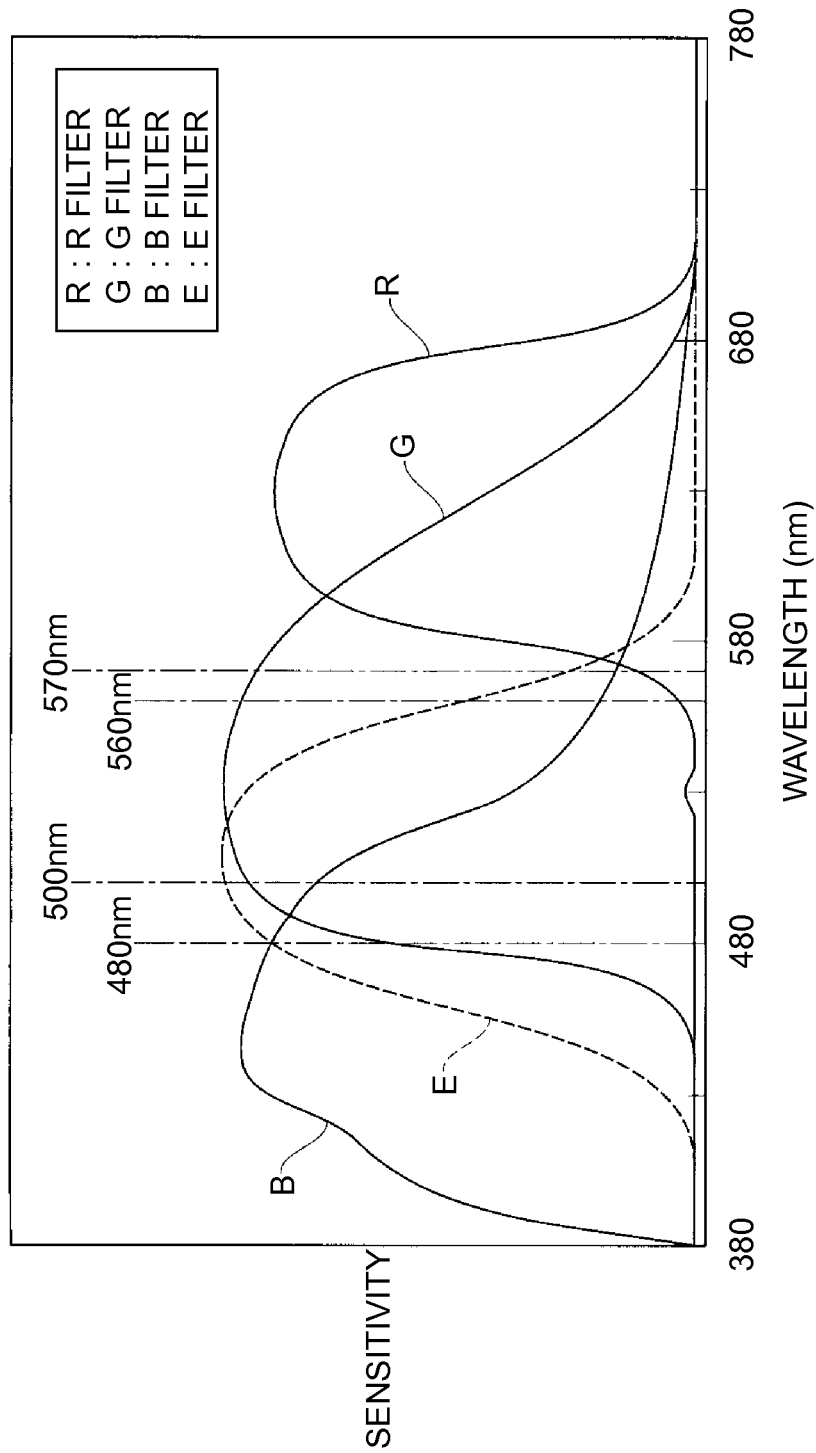
FIG. 15 is a graph showing an example of spectral sensitivity characteristics of photodiodes on which R filters, G filters, B filters and E filters are arranged.

FIG. 15 is a graph showing an example of spectral sensitivity characteristics of photodiodes on which R filters, G filters, B filters and E filters are arranged.

In FIG. 15 showing the spectral sensitivity characteristics of the color filter array (light receiving element), the peak of the transmittance of the E filter (the peak of sensitivity of E pixel) is within a range from 480 nm to 570 nm. The transmittance of the E filter is higher than the transmittances of the R and B filters at a wavelength within a range from 500 nm to 560 nm. Thus, the E filter also satisfies the foregoing conditions (2) and (3). In the color filter array, some of the G filters corresponding to a G color most contributing to the luminance signal among three RGB primary colors are thus replaced with the E filters. Accordingly, this array also satisfies the foregoing condition (4).

According to the spectral characteristics shown in FIG. 15, the E filter has a peak nearer to the short wavelength side than the G filter does. Alternatively, in some cases, the E filter has a peak nearer to the long wavelength side than the G filter does (looking a color nearer to yellow). Thus, a filter that satisfies each condition of the present invention can be selected as the E filter. For instance, the emerald filter E that satisfies the condition (1) can be selected.

<Other Color Types>

Each of the foregoing embodiments describes the color filter arrangement that includes primary color RGB color filters. Alternatively, for instance, the present invention can be applied to a four-complementary-color filter arrangement where G is added to complementary colors of the primary RGB colors, i.e., C (cyan), M (magenta) and Y (yellow). Also in this case, a filter satisfying any of the conditions (1) to (4) is adopted as the first filter of the present invention, and a filter with another color is adopted as the second color filter.

If an image pickup element where the entire or some of the G filters that are the first filters are replaced with the W filters, G2 filters or E filters are used at the positions of the first filters, the phase difference pixels may be arranged at the positions where the W filters, G2 filters or E filters are arranged.

For instance, adoption of the W filters as the filters where the phase difference pixels are arranged enables the phase difference pixels to have high sensitivity.

Another embodiment of the imaging device 10 may be, for instance, a mobile phone having a camera function, a smartphone, a PDA (Personal Digital Assistants) or a mobile game machine. Hereinafter, a smartphone is exemplified, and described in detail with reference to the drawings.

<Configuration of Smartphone>

Figure 16:
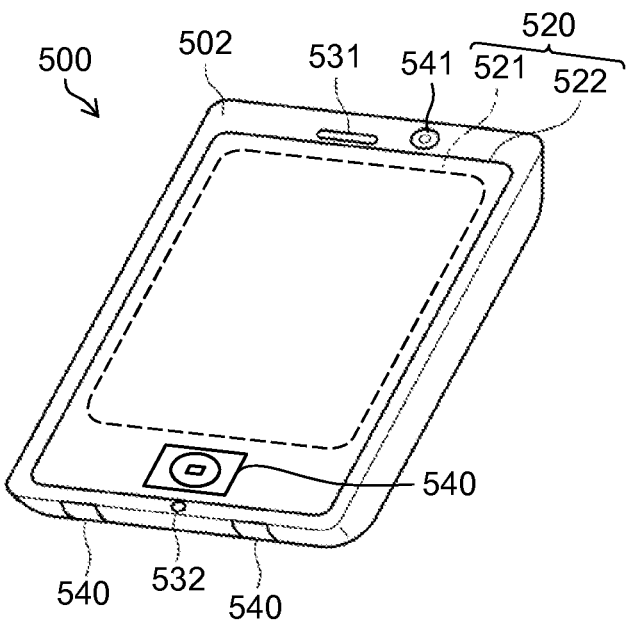
FIG. 16 is an appearance diagram of a smartphone that is another example of an imaging device.

FIG. 16 shows an appearance of a smartphone 500 that is another embodiment of the imaging device 10. The smartphone 500 shown in FIG. 16 has a flat-shaped casing 502, and includes a display input unit 520 in which a display panel 521 as a display unit and an operation panel 522 as an input unit are integrated on one surface of the casing 502. Furthermore, the casing 502 includes a speaker 531, a microphone 532, an operation unit 540, and a camera unit 541. Note that the configuration of the casing 502 is not limited thereto. Alternatively, for instance, a configuration where the display unit and the input unit are independent from each other may be adopted, or a configuration that has a folding structure or a sliding mechanism may be adopted.

Figure 17:
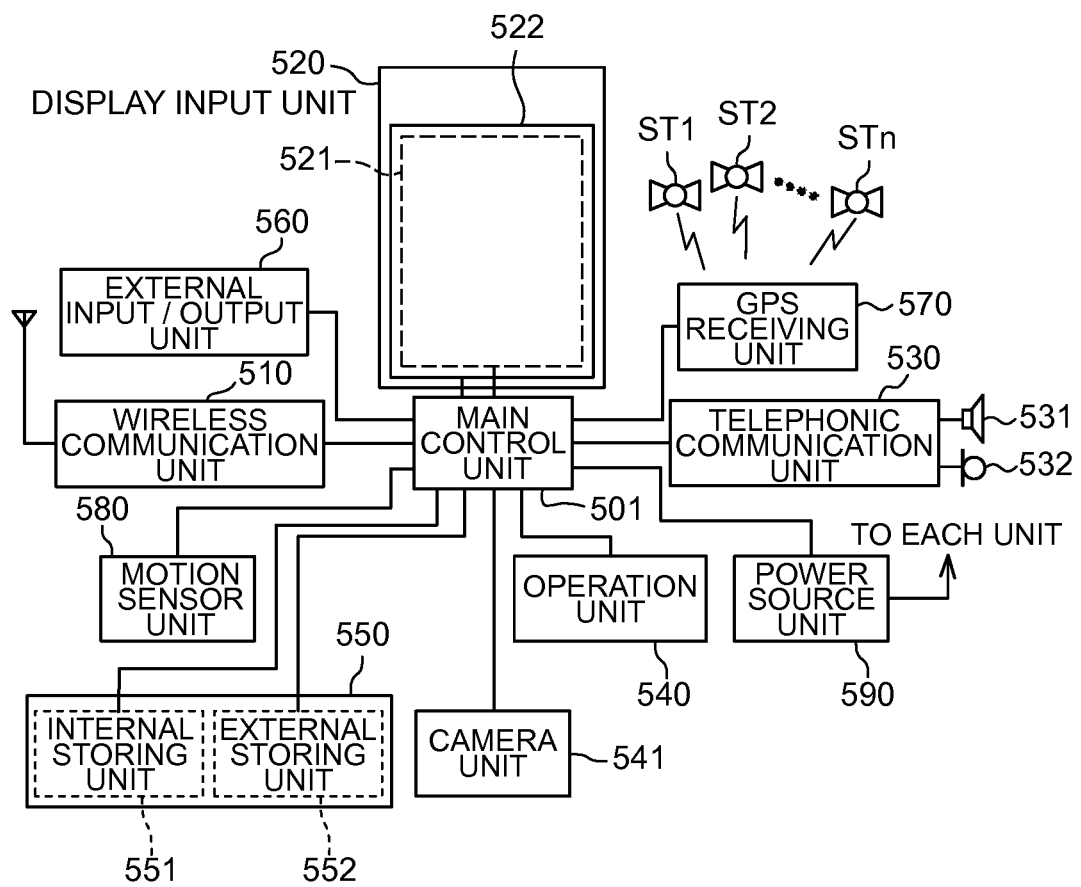
FIG. 17 is a block diagram showing a configuration of a main part of the smartphone.

FIG. 17 is a block diagram showing a configuration of the smartphone 500 shown in FIG. 16. As shown in FIG. 17, the smartphone includes main configuration elements, which are a wireless communication unit 510, a display input unit 520, a telephonic communication unit 530, the operation unit 540, the camera unit 541, a storing unit 550, an external input/output unit 560, a GPS (Global Positioning System) receiving unit 570, a motion sensor unit 580, a power source unit 590, and a main control unit 501. Furthermore, the smartphone 500 has a main function that is a wireless communication function of performing mobile wireless communication via a base station apparatus BS and a mobile communication network NW.

The wireless communication unit 510 performs wireless communication to the base station apparatus BS accommodated in the mobile communication network NW according to instructions from the main control unit 501. Through use of the wireless communication, various types of file data, such as audio data and image data, and email data and the like are transmitted and received, and web data and streaming data are received.

The display input unit 520 is what is called an touch panel that is controlled by the main control unit 501 to display images (still images and moving images) and character information and the like and visually transmit information to the user, and detect an user operation that is made in response to the displayed information, and includes the display panel 521 and the operation panel 522. Preferably, for viewing the generated 3D images, the display panel 521 is a 3D display panel.

The display panel 521 is a LCD (Liquid Crystal Display), an OELD (Organic Electro-Luminescence Display) or the like that is used as a display device. The operation panel 522 is a device that is disposed on a display screen of the display panel 521 in a manner allowing a displayed image to be viewed, and operated by a finger of the user or a stylus and detects one or multiple coordinates. When the device is operated by the finger of the user or the stylus, a detection signal generated by the operation is output to the main control unit 501. Next, the main control unit 501 detects an operation position (coordinates) on the display panel 521 on the basis of the received detection signal.

As shown in FIG. 16, the display panel 521 and the operation panel 522 of the smartphone 500 are integrated to configure the display input unit 520, and are arranged such that the operation panel 522 completely covers the display panel 521. In the case of adopting this arrangement, the operation panel 522 may has a function of detecting a user operation also in a region out of the display panel 521. In other words, the operation panel 522 may include a detection area for an overlap portion overlapping with the display panel 521 (hereinafter, referred to as a display region) and another detection area for a peripheral portion that does not overlap with the display panel 521 (hereinafter, referred to as non-display region).

The size of the display area and the size of the display panel 521 may be completely matched with each other. Alternatively, it is not necessarily to match both areas. Furthermore, the operation panel 522 may include two sensing areas that are a peripheral portion and an inner portion other than the peripheral portion. Moreover, the width of the peripheral portion is appropriately designed according to the size of the casing 502. Furthermore, a position detection scheme adopted in the operation panel 522 may be any of a matrix switch scheme, a resistance film scheme, a surface acoustic wave scheme, an infrared scheme, an electromagnetic induction scheme, a capacitance scheme and the like. Any of these schemes may be adopted.

The telephonic communication unit 530, which includes the speaker 531 and the microphone 532, converts an audio of the user input via the microphone 532 into audio data that can be processed in the main control unit 501 and outputs the data to the main control unit 501, and decodes the audio data received by the wireless communication unit 510 or the external input/output unit 560 and outputs the data from the speaker 531. As shown in FIG. 16, for instance, the speaker 531 can be mounted on the same surface as the surface on which the display input unit 520 is arranged. The microphone 532 can be mounted on the side surface of the casing 502.

The operation unit 540 is hardware keys using key switches and the like, and receives an instruction from the user. For instance, as shown in FIG. 16, the operation unit 540 is mounted below or on a lower side of the display unit on the casing 502 of the smartphone 500. This operation unit is a press button switch that is turned on by being depressed by a finger or the like, and turned off by the resilience of a spring or the like when the finger is removed.

The storing unit 550 stores a control program and control data for the main control unit 501, address data associated with the names and phone numbers of communication opposite parties, data on transmitted and received email, web data downloaded through web browsing, and downloaded content data, and temporarily stores streaming data. The storing unit 550 includes an internal storing unit 551 embedded in the smartphone, and an external storing unit 552 having a detachable external memory slot. Note that the internal storing unit 551 and the external storing unit 552, which configure the storing unit 550, are achieved using any of storing media, such as a flash memory type, hard disk type, multimedia card micro type, and card type memories (e.g. Micro SD® memory etc.), a RAM (Random Access Memory), and a ROM (Read Only Memory).

The external input/output unit 560 serves as an interface with all external devices connected to the smartphone 500, and is for direct or indirect connection to an external device via communication or the like (e.g., Universal Serial Bus (USB), IEEE1394, etc.) or a network (e.g., the Internet, wireless LAN, Bluetooth (R), RFID (Radio Frequency Identification), infrared communication (Infrared Data Association: IrDA)®, UWB (Ultra Wideband)®, ZigBee®, etc.).

The external devices connected to the smartphone 500 are, for instance, wired and wireless headsets, wired and wireless external chargers, wired and wireless data ports, a memory card connected via a card socket, SIM (Subscriber Identity Module Card)/UIM (User Identity Module Card) card, an external audio video device connected via an audio video I/O (Input/Output) terminal, a wirelessly connected external audio video device, smartphones connected in wired and wireless manners, personal computers connected in wired and wireless manners, PDAs connected in wired and wireless manners, personal computers and earphones connected in wired and wireless manners. The external input and output unit can transmits data sent from such an external device, to each configuration element in the smartphone 500, and allows data in the smartphone 500 to be transmitted to the external device.

The GPS receiving unit 570 receives GPS signals transmitted from GPS satellites ST1 to STn, according to an instruction by the main control unit 501, executes a positioning operation process based on the received GPS signals, and detects the position of the smartphone 500 that includes the latitude, longitude and altitude. When position information can be acquired from the wireless communication unit 510 or the external input/output unit 560 (e.g. a wireless LAN), the GPS receiving unit 570 can detect the position using the position information.

The motion sensor unit 580 includes, for instance, three-axis acceleration sensor and the like, and detects physical movement of the smartphone 500 according to the instruction by the main control unit 501. Through detection of the physical movement of the smartphone 500, the movement direction and acceleration of the smartphone 500 are detected. The detection result is output to the main control unit 501.

The power source unit 590 supplies power stored in a battery (not shown) to each unit of the smartphone 500 according to the instruction by the main control unit 501.

The main control unit 501 includes a microprocessor, operates according to a control program and control data stored in the storing unit 550, and integrally controls each unit of the smartphone 500. The main control unit 501 has a mobile communication function of controlling each unit of the communication system and an application processing function for performing audio communication and data communication via the wireless communication unit 510.

The application processing function can be achieved by the main control unit 501 operating according to application software stored in the storing unit 550. The application processing function is, for instance, an infrared communication function of controlling the external input/output unit 560 to perform data communication with an opposite device, an email function of transmitting and receiving email, a web browsing function of browsing web pages, and a function of generating 2D images and 3D images according to the present invention.

The main control unit 501 has an image processing function of displaying images and the like on the display input unit 520 on the basis of image data (still image and moving image data), such as received data and downloaded streaming data. The image processing function is a function of the main control unit 501 decoding the image data, applying an image processing to the decoding result, and displaying the image on the display input unit 520.

Furthermore, the main control unit 501 executes display control for the display panel 521, and operation detection control that detects user operations via the operation unit 540 and the operation panel 522.

According to execution of the display control, the main control unit 501 displays software keys, such as an icon for activating application software, and scrollbars, and further displays a window for creating email. Note that the scrollbars are software keys for accepting instructions for moving a displayed part of an image that is large and cannot be accommodated in a display region on the display panel 521.

Through execution of the operation detection control, the main control unit 501 detects a user operation via the operation unit 540, accepts an operation to the icon and an input of a character string into an input field in the window via the operation panel 522, and accepts a request of scrolling the displayed image via the scroll bars.

Furthermore, the main control unit 501 has an touch panel control function of determining whether the operation position on the operation panel 522 is in the overlap portion (display area) overlapping with the display panel 521 or the other peripheral portion that does not overlap with the display panel 521 (non-display area) and of controlling the sensing region of the operation panel 522 and the display position of the software keys.

The main control unit 501 can detect a gesture operation on the operation panel 522, and execute a preset function in response to the detected gesture operation. The gesture operation is not a conventional simple touch operation, but means drawing a trajectory by a finger, simultaneously designating multiple points, and drawing a trajectory from at least one of the multiple positions through combination of these operations.

The camera unit 541 is a digital camera that electronically takes an image using an image pickup element, such as a CMOS (Complementary Metal Oxide Semiconductor) or a CCD (Charge-Coupled Device), and has a function equivalent to the function shown in the block diagram of FIG. 3. Here, the color filter array of the image pickup element of the camera unit 541, the array of the phase difference pixels and the like may be an embodiment analogous to that of the imaging device 10. Image processing and control processes with such a color filter array (thinning-reading, phase difference detection, focus adjustment, etc.) can be performed in a manner analogous to that described above on the imaging device 10. The camera unit 541 converts image data acquired by imaging into, for instance, compressed image data, such as JPEG (Joint Photographic coding Experts Group), records the data in the storing unit 550, and outputs the data via the external input/output unit 560 and the wireless communication unit 510, through control by the main control unit 501. In the smartphone 500 shown in FIG. 16, the camera unit 541 is mounted on the same surface as that of the display input unit 520. However, the mount position of the camera unit 541 is not limited thereto. Alternatively, this unit may be mounted on the back of the display input unit 520, or multiple camera units 541 may be mounted. In the case where multiple camera units 541 are mounted, a camera unit 541 used for imaging may be switched to solely take an image, or the multiple camera units 541 may be simultaneously used for taking images.

The camera unit 541 can be used for various functions of the smartphone 500. For instance, an image acquired by the camera unit 541 can be displayed on the display panel 521. As one of input operations on the operation panel 522, an image from the camera unit 541 can be used. When the GPS receiving unit 570 detects the position, the image from the camera unit 541 may be referred to and the position may be detected. Furthermore, the image from the camera unit 541 can be referred to, and the optical axis direction of the camera unit 541 of the smartphone 500 can be detected without use of a three-axis acceleration sensor or together with use of the three-axis acceleration sensor, and the current usage environment can be detected. It is a matter of course that the image from the camera unit 541 can be used in the application software.

In the foregoing embodiment of the smartphone 500, the present invention can be applied to the color filters provided on the image pickup element of the camera unit 541. Color filters where filters with various colors are arranged according to a prescribed pattern may be arranged in the camera unit 541. Image data thinning (extraction) during moving image generation and the like can be achieved by the main control unit 501 according to, for instance, an operation instructing signal from the operation unit 540.

The smartphone 500 having the foregoing configuration can accurately perform phase difference AF during moving image taking in a manner analogous to that of the imaging device 10, and prevent or alleviate reduction in image quality of the image taken through the phase difference pixels.

[Others]

In the embodiments of the present invention, pixel signals are directly thinning-read from the image pickup element according to the thinning pattern during moving image taking. However, the embodiments are not limited thereto. Alternatively, an image on all pixels may be read from the image pickup element, pixel signals may be extracted from the read image according to the thinning pattern, and a color image according to a prescribed color array including the phase difference pixels may be acquired. Also in this case, the image size of a target image of signal processing including simultaneous processing can be reduced. Accordingly, reduction in time of processing a moving image can be facilitated. Note that, as to the method of extracting pixel signals according to the thinning pattern, the pixel signal according to the thinning pattern may be extracted by a pixel mixing process that adds or mixes the output signals from multiple surrounding pixels having the same color. In particular, by performing the pixel mixing process in the image pickup element immediately after reading, the time of processing the moving image can be further reduced.

The color filter array of the image pickup element to which the present invention is applied is not limited to the examples shown in FIGS. 10 to 12. Alternatively, for instance, in the color filter array, only 3×3-pixel A arrays or B arrays in the basic array pattern P shown in FIG. 10 or only 3×3-pixel B arrays in the basic array pattern P shown in FIG. 11 may be repeatedly arranged in the horizontal direction and the vertical direction. That is, the color filter array may be an array where the basic array pattern of M×N pixels (M, N: integers at least three) are repeatedly arranged, and at least one first filter corresponding to the first color (the G filter, W filter, G1 filter, G2 filter, or E filter in this example) and at least one second filter corresponding to the second color (the R filter or B filter in this example) are arranged in the first direction and the second direction in the basic array pattern. Note that the size (M×N pixels) of the basic array pattern may conform to an array pattern corresponding to another number of pixels. Although increase in the number of pixels of the basic array pattern complicates signal processing, such as simultaneous processing, increase in the size of the basic array pattern cannot exert specific advantageous effects. Accordingly, in view of preventing the signal processing from being complicated, it is preferable that the size of the basic array pattern be 10×10 pixels or less, which is not too large. It is further preferable that the size be 6×6 pixels or less. It is preferable that the minimum basic array pattern be 3×3 pixels. Furthermore, the filter corresponding to the second color may include a filter having a color other than the colors of R filter and the B filter.

In the foregoing embodiment, the case has been described where the pixel interval between the first phase difference pixel p1 and the second phase difference pixel p2 is 4, the repetition period of the phase difference pixels is 12, and the extraction pixel period (reading period in the vertical direction) is 4. However, these periods are not specifically limited. It is sufficient that "the number of pixels t1 in the vertical direction between the first phase difference pixel p1 and the second phase difference pixel p2 and the number of corresponding pixels t2 for the extraction pixel period in the vertical direction satisfy t1=t2×l (l is an integer of one or greater)" and "the number of pixels corresponding to the repetition period in the vertical direction between the first phase difference pixel p1 and the second phase difference pixel p2 is a common multiple (preferably, the least common multiple) of the number of corresponding pixels of the extraction pixel period in the vertical direction and the number of pixels of the basic array pattern in the vertical direction".

Furthermore, the present invention can be applied to image pickup elements that include complementary color filters having complementary colors of the primary colors RGB, i.e., C (cyan), M (magenta) and Y (yellow), or a color filter array including the complementary color filters and color filters having another color added thereto.

Moreover, the arrangement positions of the phase difference pixels are not specifically limited. It is sufficient that the positions are only arranged on lines to be thinning-read during moving image taking.

The image pickup element applied to the present invention is not limited to the element where multiple pixels and color filters are arranged into a square lattice in the horizontal direction and the vertical direction as shown in FIG. 4 and the like. Alternatively, the element may have an oblique lattice array (more specifically, an array acquired by turning the color filter array shown in FIG. 10 etc. by 45°). In this case, the basic array pattern also has an oblique lattice array pattern.

It is a matter of course that the present invention is not limited to the foregoing embodiments, and various modifications may be made in a scope without departing from the spirit of the present invention.

What is claimed is:

1. An imaging device, comprising:
an imaging lens;
an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;

a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;

a moving image generating device which generates moving image data, based on the thinned color image;

a phase difference detection device which detects a phase difference between output signals that correspond to the first and second phase difference pixels included in the thinned color image, based on each output signal; and a focus adjustment device which adjusts a focus position of the imaging lens based on the phase difference detected by the phase difference detection device, wherein the prescribed color filter array includes first filters corresponding to at least one first color, and second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction, wherein in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

2. The imaging device according to claim 1,
wherein the first filters are arranged on the first and second phase difference pixels,
the pixel line that does not include any of the first phase difference pixel and the second phase difference pixel in the extracted pixel group includes pixels corresponding to the first filters, and
in the extracted pixel group, the pixels corresponding to the first filters on the pixel line that does not include any of the first phase difference pixel and the second phase difference pixel are arranged on positions adjacent to the first phase difference pixel or the second phase difference pixel.

3. The imaging device according to claim 1,
wherein the thinning pattern has an extraction pixel period defining a period in the second direction pertaining to thinning-reading or extraction of the pixel signals, and
the number of pixels t1 pertaining to the second direction between the first phase difference pixel and the second phase difference pixel and the number of corresponding pixels t2 of the extraction pixel period in the second direction satisfy $t1=t2\times l$ (l is an integer equal to or greater than one).

4. The imaging device according to claim 1,
wherein the thinning pattern has an extraction pixel period defining a period in the second direction pertaining to thinning-reading or extraction of the pixel signals, and
the number of pixels corresponding to a repetition period of the first phase difference pixel and the second phase difference pixel in the second direction is a common multiple of the number of corresponding pixels of the extraction pixel period in the second direction and the number of pixels of the basic array pattern in the second direction.

5. The imaging device according to claim 1,
wherein the number of pixels between the first phase difference pixel and the second phase difference pixel in the second direction is different from the number of pixels of the basic array pattern in the second direction.

6. The imaging device according to claim 1,
wherein the extracted pixel group pertains to array patterns of the first filters and the second filters, and has an array pattern identical to the basic array pattern.

7. The imaging device according to claim 1,
wherein, in the color filter array, a ratio of the number of all pixels having the first color corresponding to the first filters is greater than ratios of the numbers of pixels of the respective second colors corresponding to the second filters, and
the first and the second phase difference pixels are arranged on positions of the first filters.

8. The imaging device according to claim 1,
wherein the first filters are arranged in M×N pixels (M, N: integers equal to or greater than three), and the M×N pixels are repeatedly arranged in the first and second directions.

9. The imaging device according to claim 8,
wherein one or two phase difference pixels that are one of the first and the second phase difference pixels are arranged in the M×N pixels.

10. The imaging device according to claim 1,
wherein the first and the second phase difference pixels are arranged as a pair in the second direction.

11. The imaging device according to claim 1,
wherein the first and second phase difference pixels are alternately arranged on one pixel line extending in the first direction.

12. The imaging device according to claim 1, wherein the thinned color image has all pixels on the pixel lines in the first direction.

13. The imaging device according to claim 12, wherein, in the thinned color image, pixels having a color identical to a color of pixels at positions of the first and second phase difference pixels are arranged, in the first directions, adjacent to the first and second phase difference pixels.

14. The imaging device according to claim 1,
wherein, in the basic array pattern, the color filters are arranged according to an array pattern corresponding to M×M (M is an integer equal to or greater than three) pixels in the first direction and the second direction, and
the basic array pattern in which the first phase difference pixel is arranged, the basic array pattern in which the second phase difference pixel is arranged, and at least one basic array pattern that does not include any of the first phase difference pixel and the second phase difference pixel are arranged in the second direction.

15. The imaging device according to claim 1,
wherein, in the basic array pattern, the color filters are arranged according to an array pattern corresponding to M×N (M is an integer equal to or greater than three, and N is an even number equal to or greater than six) pixels in the first direction and the second direction,
the basic array pattern includes each one of two types of sub-arrays which are a first sub-array and a second sub-array and in which the color filters are arranged according to an array pattern corresponding to M×(N/2) pixels,
in each of the first sub-array and the second sub-array, at least one pixel of each of the first filters and the second filters corresponding to the respective second colors is arranged, and
the basic array pattern that includes the first phase difference pixel and the second phase difference pixel, and the basic array pattern that does not include any of the first phase difference pixel and the second phase difference pixel are arranged in the second direction, and
the first phase difference pixel is arranged in the first sub-array, and the second phase difference pixel is arranged in the second sub-array.

16. The imaging device according to claim 1,
wherein, in the basic array pattern, the color filters are arranged according to an array pattern corresponding to M×M (M is an integer equal to or greater than six) pixels in the first direction and the second direction, and
the basic array pattern includes each two of two types of sub-arrays which are first sub-arrays and second sub-arrays and in which the color filters are arranged according to an array pattern corresponding to (M/2)×(M/2) pixels,
in each of the first sub-array and the second sub-array, at least one pixel of each of the first filters and the second filters corresponding to the respective second colors is arranged, and
the first sub-array that includes the first phase difference pixel, the second sub-array that does not include any of the first phase difference pixel and the second phase difference pixel, the first sub-array that includes the second phase difference pixel, and the second sub-array that does not include any of the first phase difference pixel and the second phase difference pixel are arranged in the second direction.

17. The imaging device according to claim 16,
wherein the first color is a green (G) color, the second colors are a red (R) color and a blue (B) color, the first filters are G filters, and the second filters are R filters and B filters,
in the basic array pattern, the color filters are arranged according to an array pattern corresponding to 6×6 pixels in the first direction and the second direction, and the first sub-array and the second sub-array are arranged according to an array pattern corresponding to 3×3 pixels in the first direction and the second direction,
the first sub-array is arranged in one of diagonal line directions of the basic array pattern, and the second sub-array is arranged in another diagonal line direction of the basic array pattern,
the G filters are arranged on a center pixel and four corner pixels of each of the first sub-array and the second sub-array,
the R filters are arranged on pixels adjacent in the second direction to the center pixel in the first sub-array, and pixels adjacent in the first direction to the center pixel in the second sub-array,
the B filters are arranged on pixels adjacent in the first direction to the center pixel in the first sub-array, and pixels adjacent in the second direction to the center pixel in the second sub-array, and
the G filters are arranged on the first phase difference pixel and the second phase difference pixel.

18. The imaging device according to claim 1,
wherein pixels having transparent filters are used for the first and second phase difference pixels.

19. An imaging device, comprising:
an imaging lens;
an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;
a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;
a moving image generating device which generates moving image data, based on the thinned color image;
a phase difference detection device which detects a phase difference between output signals that correspond to the first and second phase difference pixels included in the thinned color image, based on each output signal; and
a focus adjustment device which adjusts a focus position of the imaging lens based on the phase difference detected by the phase difference detection device,
wherein the prescribed color filter array includes first filters corresponding to at least one first color having a peak of transmittance within a wavelength range from 480 nm to 570 nm, and second filters corresponding to at least two second colors having peaks of transmittance out of this range, and has a basic array pattern according to which the first filters and the second filters are arranged, the basic array pattern being repeatedly arranged in the first direction and the second direction, and
an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction, wherein in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

20. An imaging device, comprising:
an imaging lens;
an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;
a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;
a moving image generating device which generates moving image data, based on the thinned color image;
a phase difference detection device which detects a phase difference between output signals that correspond to the first and second phase difference pixels included in the thinned color image, based on each output signal; and
a focus adjustment device which adjusts a focus position of the imaging lens based on the phase difference detected by the phase difference detection device,
wherein the prescribed color filter array includes first filters corresponding to at least one first color, and second filters corresponding to at least two second colors having lower transmittances than the first filters within a wavelength range from 500 nm to 560 nm, and has a basic array pattern according to which the first filters and the second filters are arranged, the basic array pattern being repeatedly arranged in the first direction and the second direction, and
an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction, wherein
in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

21. An imaging device, comprising:
an imaging lens;
an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed;
a color image acquisition device which performs thinning-reading pixel signals according to a thinning pattern from the image pickup element, or extracting pixel signals according to the thinning pattern from a color image that is read from the image pickup element and corresponds to the prescribed color filter array, and acquiring a thinned color image;
a moving image generating device which generates moving image data, based on the thinned color image;
a phase difference detection device which detects a phase difference between output signals that correspond to the first and second phase difference pixels included in the thinned color image, based on each output signal; and
a focus adjustment device which adjusts a focus position of the imaging lens based on the phase difference detected by the phase difference detection device,
wherein the prescribed color filter array includes first filters corresponding to at least two first colors that include a color most contributing to luminance signals among three primary colors and a fourth color different from the three primary colors, and second filters corresponding to at least two second colors other than the first colors, and has a basic array pattern according to which the first filters and the second filters are arranged, the basic array pattern being repeatedly arranged in the first direction and the second direction, and
an extracted pixel group including pixels corresponding to the pixel signals thinning-read or extracted by the color image acquisition device from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction, wherein
in the thinned color image, pixels having a color identical to a color of pixels at positions of the first and second phase difference pixels are arranged, in at least one of the first and second directions, adjacent to the first and second phase difference pixels, the device further comprises an interpolating calculation device which calculates pixel values of the pixels at the positions of the first and second phase difference pixels in the thinned color image by interpolating pixel values of surrounding pixels including pixels having a same color adjacent to the first and the second phase difference pixels, and the moving image generating device generates the moving image data based on a color image using values calculated by the interpolating calculation device as pixel values of pixels at positions of the first and second phase difference pixels in the thinned color image.

22. An image processing method in an imaging device comprising an imaging lens, and an image pickup element in which color filters with a prescribed color filter array are arranged on multiple pixels including photoelectric conversion elements arranged in a first direction and a second direction perpendicular to the first direction, the image pickup element including first and second phase difference pixels on which a subject image having passed through different first and second areas of the imaging lens is pupil-divided and image-formed, the method including:

a color image acquisition step of thinning-reading pixel signals according to a thinning pattern from the image pickup element, or extracting pixel signals according to the thinning pattern from a color image that is read from the image pickup element and corresponds to the prescribed color filter array, and acquiring a thinned color image;

a moving image generating step of generating moving image data, based on the thinned color image;

a phase difference detection step of detecting a phase difference between output signals that correspond to the first and second phase difference pixels included in the thinned color image, based on each output signal; and a focus adjustment step of adjusting a focus position of the imaging lens based on the phase difference detected by the phase difference detection step, and adjusting the focus position of the imaging lens in parallel with generation of the moving image data by the moving image generating step, wherein the prescribed color filter array includes first filters corresponding to at least one first color, second filters corresponding to at least two second colors having lower contribution ratios for acquiring luminance signals than the first color has, and has a basic array pattern according to which the first filters and the second filters are arranged, the basic array pattern being repeatedly arranged in the first direction and the second direction, and an extracted pixel group including pixels corresponding to the pixel signals thinning-read or extracted by the color image acquisition step from among the multiple pixels periodically includes a pixel line that includes the first phase difference pixel and extends in the first direction, a pixel line that includes the second phase difference pixel and extends in the first direction, and a pixel line that does not include any of the first phase difference pixel and the second phase difference pixel and extends in the first direction, wherein in the thinned color image, pixels having a color identical to a color of pixels at positions of the first and second phase difference pixels are arranged, in at least one of the first and second directions, adjacent to the first and second phase difference pixels, the method further comprises an interpolating calculation step of calculating pixel values of the pixels at the positions of the first and second phase difference pixels in the thinned color image by interpolating pixel values of surrounding pixels including pixels having a same color adjacent to the first and the second phase difference pixels, and the moving image generating step generates the moving image data based on a color image using values calculated by the interpolating calculation step as pixel values of pixels at positions of the first and second phase difference pixels in the thinned color image.

* * * * *